US012369467B2

(12) United States Patent
Qian et al.

(10) Patent No.: US 12,369,467 B2
(45) Date of Patent: Jul. 22, 2025

(54) FLEXIBLE ARRAY SUBSTRATE AND DISPLAY APPARATUS

(71) Applicant: BOE TECHNOLOGY GROUP CO., LTD., Beijing (CN)

(72) Inventors: Yuhan Qian, Beijing (CN); Libin Liu, Beijing (CN); Long Han, Beijing (CN); Fangxu Cao, Beijing (CN); Pinfan Wang, Beijing (CN); Yang Yu, Beijing (CN); Wenqiang Li, Beijing (CN); Zubin Lv, Beijing (CN); Li Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 627 days.

(21) Appl. No.: 17/788,755

(22) PCT Filed: Jun. 11, 2021

(86) PCT No.: PCT/CN2021/099842
§ 371 (c)(1),
(2) Date: Jun. 24, 2022

(87) PCT Pub. No.: WO2022/017058
PCT Pub. Date: Jan. 27, 2022

(65) Prior Publication Data
US 2023/0031474 A1    Feb. 2, 2023

(30) Foreign Application Priority Data
Jul. 22, 2020  (CN) .......................... 202010711869.2

(51) Int. Cl.
*H10K 59/131*      (2023.01)
*H10D 86/40*       (2025.01)
(Continued)

(52) U.S. Cl.
CPC ......... *H10K 59/131* (2023.02); *H10D 86/411* (2025.01); *H10D 86/441* (2025.01); *H10D 86/60* (2025.01); *H10K 50/84* (2023.02); *H10K 59/1213* (2023.02); *H10K 59/1216* (2023.02); *H10K 77/111* (2023.02); *H10K 59/873* (2023.02)

(58) Field of Classification Search
CPC ... H10K 59/131; H10K 50/84; H10K 59/1213
(Continued)

(56) References Cited

U.S. PATENT DOCUMENTS 10,121,842 B2   11/2018   Lee et al.
10,684,716 B2    6/2020   Zhai
(Continued)

FOREIGN PATENT DOCUMENTS

CN    109189265 A    1/2019
CN    109920803 A    6/2019
(Continued)

OTHER PUBLICATIONS

English Translation of International Search Report and Written Opinion from PCT/CN2021/099842 dated Aug. 26, 2021.

*Primary Examiner* — Xia L Cross
(74) *Attorney, Agent, or Firm* — Calfee, Halter & Griswold LLP

(57) ABSTRACT

A flexible array substrate includes at least one stretchable region; wherein the flexible array substrate is provided with a plurality of through holes within the stretchable region, and the plurality of through holes divide the stretchable region into a pixel island area for displaying and a bridging area for signal transmission; the bridging area includes a source-drain bridging area. The flexible array substrate, in the source-drain bridging area, includes: a base substrate, a first source-drain metal layer, a first insulating material layer, a second source-drain metal layer, a second insulating material layer, and an encapsulation layer that are sequentially stacked.

20 Claims, 14 Drawing Sheets

(51) Int. Cl.
*H10D 86/60* (2025.01)
*H10K 50/84* (2023.01)
*H10K 59/121* (2023.01)
*H10K 77/10* (2023.01)
*H10K 59/80* (2023.01)

(58) Field of Classification Search
USPC .......................................................... 257/40
See application file for complete search history.

(56) References Cited

U.S. PATENT DOCUMENTS

| | | |
|---|---|---|
| 10,777,630 B2 | 9/2020 | Lee et al. |
| 2016/0190389 A1* | 6/2016 | Lee .................... H10K 59/8731 438/28 |
| 2016/0211486 A1 | 7/2016 | Ohyama et al. |
| 2019/0074345 A1 | 3/2019 | Lee et al. |
| 2019/0107911 A1 | 4/2019 | Zhai |
| 2020/0119127 A1* | 4/2020 | Tian ..................... H10K 77/111 |
| 2020/0350392 A1 | 11/2020 | Lee et al. |
| 2022/0238630 A1* | 7/2022 | Yang ...................... H10D 86/60 |

FOREIGN PATENT DOCUMENTS

| | | |
|---|---|---|
| CN | 110246868 A | 9/2019 |
| CN | 110459571 A | 11/2019 |
| CN | 110783348 A | 2/2020 |
| CN | 111244322 A | 6/2020 |
| CN | 111261693 A | 6/2020 |
| CN | 210892787 U | 6/2020 |
| CN | 210897287 U | 6/2020 |

\* cited by examiner

FLEXIBLE ARRAY SUBSTRATE AND DISPLAY APPARATUS

CROSS REFERENCE TO RELATED APPLICATIONS

The present application is the U.S. national phase application of PCT Application No. PCT/CN2021/099842, filed Jun. 11, 2021, which claims priority to a Chinese patent application No. 202010711869.2, filed Jul. 22, 2020, and entitled "Flexible Array Substrate and Display Apparatus", the entire contents of which are incorporated herein by reference.

TECHNICAL FIELD

The disclosure relates to the field of display technology, and in particular, to a flexible array substrate and a display apparatus.

BACKGROUND

Flexible stretchable display panels are widely used in display apparatus with curved display surfaces. In the flexible stretchable display panel, the stretchable region may be designed with a hole cut to form an island bridge area composed of a pixel island area and a bridging area. Isolation grooves may be provided around the island bridge area to prevent moisture from invading the pixel island area and bridging area. However, the arrangement of the isolation grooves increases the density of signal leads in the bridging area and makes the distance between the signal leads and the isolation groove smaller, which results in that the moisture easily penetrates into the signal leads from the isolation groove, thereby reducing the electrical performance of the bridging area.

The above information disclosed in this background section is only for enhancing understanding related art of the disclosure and may contain information that does not form the prior art which is already known to those skilled in the art.

SUMMARY

The disclosure is directed to provide a flexible array substrate and a display apparatus to improve the encapsulation effect of the stretchable region.

To achieve the above-mentioned purpose of the application, the disclosure proposes the following technical solutions.

According to a first aspect of the disclosure, a flexible array substrate is provided, including at least one stretchable region; wherein the flexible array substrate is provided with a plurality of through holes within the stretchable region, and the plurality of through holes divide the stretchable region into a pixel island area for displaying and a bridging area for signal transmission; the bridging area includes a source-drain bridging area, and the flexible array substrate, in the source-drain bridging area, includes:
  a base substrate;
  a first source-drain metal layer, provided on one side of the base substrate, and including a plurality of first source-drain leads;
  a first insulating material layer, provided on one side of the first source-drain metal layer away from the base substrate;
  a second source-drain metal layer, provided on one side of the first insulating material layer away from the base substrate; wherein the second source-drain metal layer includes a plurality of second source-drain leads, and a number of the second source-drain leads is less than a number of the first source-drain leads;
  a second insulating material layer, provided on one side of the second source-drain metal layer away from the base substrate; wherein the second insulating material layer is provided with a plurality of isolation grooves, and an orthographic projection of the isolation grooves on the second source-drain metal layer isolates the second source-drain leads and the through holes; and
  an encapsulation layer, provided on one side of the second insulating material layer away from the base substrate.

According to some embodiments of the disclosure, in the source-drain bridging area, a minimum distance between an orthographic projection of the second source-drain leads on the second insulating material layer and the isolation grooves is not less than a distance between two adjacent second source-drain leads.

According to some embodiments of the disclosure, in the source-drain bridging area, a width of the isolation grooves is not greater than twice a distance between two adjacent second source-drain leads.

According to some embodiments of the disclosure, in the source-drain bridging area, a width of the isolation grooves is equal to 0.9-1.1 times a distance between two adjacent second source-drain leads; more than one of the isolation grooves are provided between one of the second source-drain leads and one of the through holes adjacent thereto, and a distance between two adjacent isolation grooves is equal to 0.9-1.1 times the distance between two adjacent second source-drain leads.

According to some embodiments of the disclosure, in the source-drain bridging area, a distance between two adjacent second source-drain leads is not greater than 2 times a width of the second source-drain leads.

According to some embodiments of the disclosure, in the source-drain bridging area, the second source-drain leads are arranged at equal intervals; two adjacent through holes in the source-drain bridging area are located at a same minimum distance to the second source-drain leads.

According to some embodiments of the disclosure, in the source-drain bridging area, a distance between two adjacent first source-drain leads is not greater than a distance between two adjacent second source-drain leads.

According to some embodiments of the disclosure, in the source-drain bridging area, a minimum distance between an orthographic projection of the first source-drain lead on the second insulating material layer and the isolation groove is not greater than a minimum distance between an orthographic projection of the second source-drain lead on the second insulating material layer and the isolation groove.

According to some embodiments of the disclosure, in the source-drain bridging area, an orthographic projection of the first source-drain lead on the second insulating material layer at least partially overlaps with the isolation groove.

According to some embodiments of the disclosure, in the source-drain bridging area, a minimum distance between an orthographic projection of the first source-drain lead on the second insulating material layer and the isolation groove is 1.5-2.7 μm; a minimum distance between an orthographic projection of the second source-drain lead on the second insulating material layer and the isolation groove is 4.5-6.0 μm.

According to some embodiments of the disclosure, a number of the first source-drain leads is greater than a number of the second source-drain leads by 1 or 2.

According to some embodiments of the disclosure, a width of an end of the isolation groove away from the base substrate is smaller than a width of another end of the isolation groove close to the base substrate.

According to some embodiments of the disclosure, in the source-drain bridging area, an extending direction of the first source-drain lead is parallel or perpendicular to an extending direction of the through hole; and an extending direction of the second source-drain lead is parallel or perpendicular to the extending direction of the through hole.

According to some embodiments of the disclosure, the pixel island area includes a plurality of sub-pixels; a size of any one of the sub-pixels along a row direction is a first size, a distance between two adjacent second source-drain leads in the source-drain bridging area is a second size, and the first size is larger than the second size.

According to some embodiments of the disclosure, the through holes include a first strip hole extending in a row direction and a second strip hole extending in a column direction; and the source-drain bridging area is located between a widthwise end of the first strip hole and a lengthwise side of the second strip hole.

According to some embodiments of the disclosure, the pixel island area is located between two adjacent first strip holes, and is located between two adjacent second strip holes; the pixel island area includes four pixels, and any one of the pixels includes a red sub-pixel, a green sub-pixel and a blue sub-pixel.

According to some embodiments of the disclosure, in the pixel island area, the four pixels are formed into two pixel rows, and any one of the pixel rows includes two pixels arranged along the row direction; and wherein, in any one of the pixel rows, a pixel electrode of the blue sub-pixel and a pixel electrode of the red sub-pixel are arranged along the row direction, and are located at one side of a pixel electrode of the green sub-pixel away from another one of the pixel rows.

According to some embodiments of the disclosure, the flexible array substrate includes a plurality of sub-pixels provided in an array in the pixel island area, any one of the sub-pixels includes a pixel driving circuit and a pixel electrode electrically connected to the pixel driving circuit; and the pixel driving circuit includes a storage capacitor, a first thin film transistor, a second thin film transistor, a third thin film transistor, a fourth thin film transistor, a fifth thin film transistor, a sixth thin film transistor and a seventh thin film transistor; wherein, a first end of the first thin film transistor is configured to load an initial signal, a second end of the first thin film transistor is electrically connected to a first electrode plate of the storage capacitor, and a control end of the first thin film transistor is configured to load a reset signal;

a first end of the second thin film transistor is electrically connected to a second end of the third thin film transistor and a first end of the sixth thin film transistor, and a second end of the second thin film transistor is electrically connected to the first electrode plate of the storage capacitor, and a control end of the second thin film transistor is configured to load a scan signal;

a first end of the third thin film transistor is electrically connected to a second end of the fourth thin film transistor and a second end of the fifth thin film transistor, and a control end of the third thin film transistor is electrically connected to the first electrode plate of the storage capacitor;

a first end of the fourth thin film transistor is configured to load a data signal, and a control end of the fourth thin film transistor is configured to load the scan signal;

a first end of the fifth thin film transistor is configured to load a power supply voltage, and a control end of the fifth thin film transistor is configured to load an enable signal;

a second end of the sixth thin film transistor is electrically connected to the pixel electrode, and a control end of the sixth thin film transistor is configured to load the enable signal;

a first end of the seventh thin film transistor is configured to load the initial signal, a second end of the seventh thin film transistor is electrically connected to the pixel electrode, and a control end of the seventh thin film transistor is configured to load the reset signal; and a second electrode plate of the storage capacitor is configured to load the power supply voltage.

According to some embodiments of the disclosure, the pixel island area includes a first pixel driving circuit column, a second pixel driving circuit column, a third pixel driving circuit column, a fourth pixel driving circuit column, a fifth pixel driving circuit column and a sixth pixel driving circuit column arranged in sequence along a preset direction, any one of the first to sixth pixel driving circuit columns includes a plurality of the pixel driving circuits arranged in a column direction, and the preset direction is parallel to a row direction;

in the source-drain bridging area, the number of the first source-drain leads is five; a first one of the first source-drain leads along the preset direction is configured to load the data signal to the first pixel driving circuit column; a second one of the first source-drain leads along the preset direction is configured to load the data signal to the second pixel driving circuit column; and a fourth one of the first source-drain leads along the preset direction is configured to load the data signal to the fifth pixel driving circuit column.

According to some embodiments of the disclosure, in the source-drain bridging area, the number of the second source-drain leads is four; a first one of the second source-drain leads along the preset direction is configured to load the power supply voltage to the first to sixth pixel driving circuit columns; a second one of the second source-drain leads along the preset direction is configured to load the data signal to the third pixel driving circuit column; a third one of the second source-drain leads along the preset direction is configured to load the data signal to the fourth pixel driving circuit column; and a fourth one of the second source-drain leads along the preset direction is configured to load the data signal to the sixth pixel driving circuit column.

According to a second aspect of the disclosure, a display apparatus is provided, including the flexible array substrate as described above.

In the flexible array substrate and display apparatus according to the disclosure, two source-drain metal layers are provided in the source-drain bridging area, which can increase the width of each source-drain lead and the distance between adjacent source-drain leads formed by the source-drain metal layers, and reduce the interference between the source-drain leads as well as the impedance of the source-drain leads, thereby improving the bendability of the source-drain leads, and further improving the stretchability and electrical stability of the stretchable region. In addition, the number of the second source-drain leads is less than that of the first source-drain leads, so that the distance between the second source-drain lead and the isolation groove can be increased, thereby reducing the risk of moisture invading the second source-drain lead through the isolation groove, improving the encapsulation reliability of the stretchable region, and further improving the electrical stability of the stretchable region.

BRIEF DESCRIPTION OF THE DRAWINGS

The above and other features and advantages of the disclosure will become more apparent from the detailed description of exemplary embodiments thereof with reference to the accompanying drawings.

FIG. 6 illustrates relative positional relationship between the through holes, the first source-drain leads, the second source-drain leads, and the isolation grooves.

Figure 1:
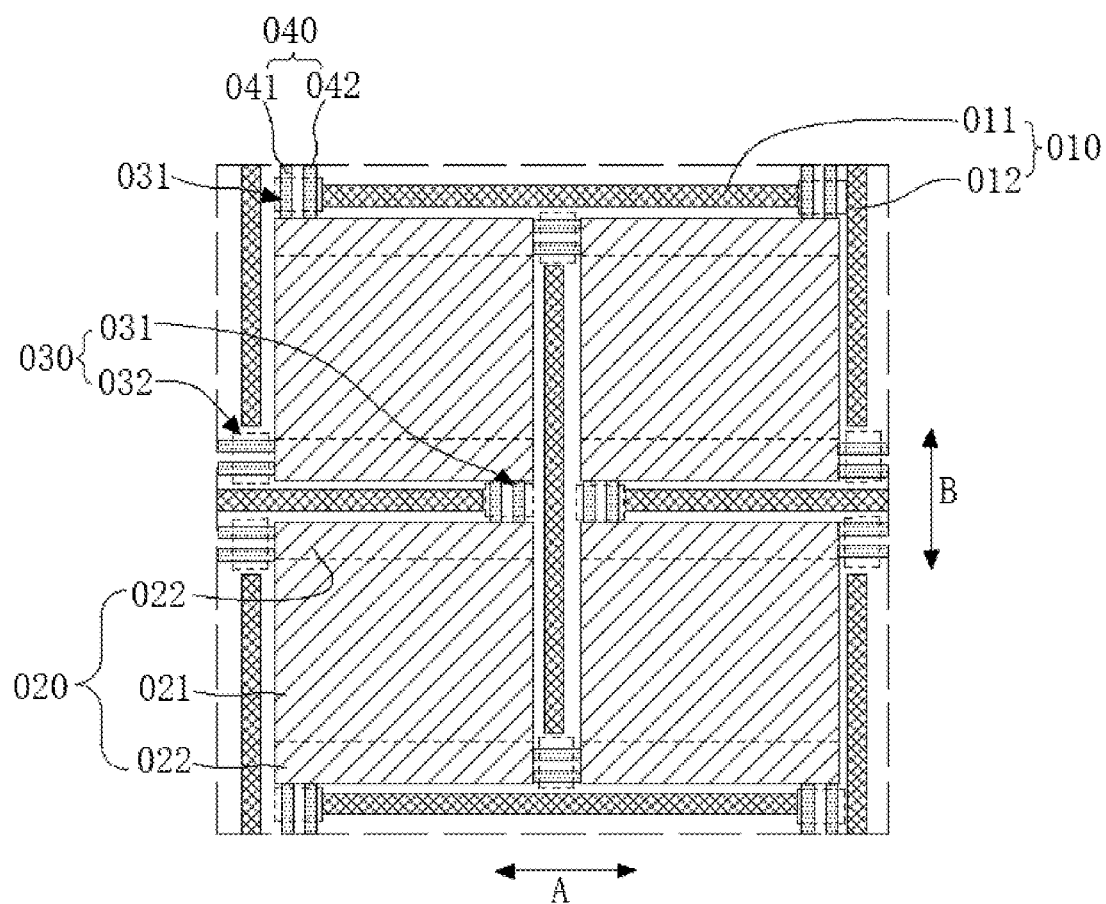
FIG. 1 is a schematic structural diagram of a stretchable region according to some embodiments of the disclosure.

The main reference numbers in the drawings are described as follows:

A: row direction; B: column direction; C: preset direction; 010: through hole; 010a: opening area; 011: first strip hole; 012: second strip hole; 020: pixel island area; 021: pixel distribution area; 022: pixel wiring area; 030: bridging area; 031: source-drain bridging area; 032: gate bridging area; 040: source-drain lead; 041: power lead; 042: data lead; 050: supporting substrate; 0681: first electrode plate of storage capacitor; 0682: second electrode plate of storage capacitor; 100: base substrate; 200: first source-drain metal layer; 201: first source-drain lead; 211: first connecting lead; 212: second connecting lead; 213: third connecting lead; 221: first source-drain via area; 222: second source-drain via area; 223: third source-drain via area; 224: fourth source-drain via area; 225: fifth source-drain via area; 226: sixth source-drain via area; 227: seventh source-drain via area; 228: eighth source-drain via area; 229: ninth source-drain via area; 231: first metal lead; 232: second metal lead; 233: third metal lead; 234: fourth metal lead; 235: fifth metal lead; 246: sixth metal lead; 247: seventh metal lead; 248: eighth metal lead; 249: ninth metal lead; 2410: tenth metal lead; 2411: eleventh metal lead; 2412: twelfth metal lead; 300: first insulating material layer; 301: first passivation layer; 302: first planarization layer; 400: second source-drain metal layer; 401: second source-drain lead; 411: column-wise power lead; 412: row-wise power lead; 413: transfer pad; 4313: thirteenth metal lead; 4314: fourteenth metal lead; 4315: fifteenth metal lead; 4316: sixteenth metal lead; 500: second insulating material layer; 501: second planarization layer; 502: second passivation layer; 503: isolation groove; 600: encapsulation layer; 701: shielding layer; 702: third insulating material layer; 703: organic light-emitting layer; 704: common electrode layer; 7051: pixel electrode of red sub-pixel; 7052: pixel electrode of green sub-pixel; 7053: pixel electrode of blue sub-pixel; 810: semiconductor layer; 8111: first channel area; 8112:

second channel area; 8113: third channel area; 8114: fourth channel area; 8115: fifth channel area; 8116: sixth channel area; 8117: seventh channel area; 8121: first conductive segment; 8122: second conductive segment; 8123: third conductive segment; 8124: fourth conductive segment; 8125: fifth conductive segment; 8126: sixth conductive segment; 8127: seventh conductive segment; 8131: first via area of semiconductor layer; 8132: second via area of semiconductor layer; 8133: third via area of semiconductor layer; 8136: sixth via area of semiconductor layer; 8137: seventh via area of semiconductor layer; 8211: first gate lead; 8212: second gate lead; 8213: third gate lead; 8221: scan lead; 8222: enable lead; 8223: reset lead; 8231: first lead area; 8232: second lead area; 8234: fourth lead area; 8235: fifth lead area; 8236: sixth lead area; 8237: seventh lead area; 8245: fifth via area of gate layer; 8311: fourth gate lead; 8312: fifth gate lead; 8313: sixth gate lead; 8321: initialization lead; 8322: auxiliary electrode plate; 8334: fourth via area of gate layer; 8338: eighth via area of gate layer; 8339: ninth via area of gate layer.

DETAILED DESCRIPTION

Exemplary embodiments will now be described more fully with reference to the accompanying drawings. These embodiments, however, can be embodied in various forms and should not be construed as limited to the examples set forth herein. Instead, these embodiments are provided so that this disclosure will be thorough and complete, and will fully convey the concept of these embodiments to those skilled in the art. The described features, structures, or characteristics may be combined in any suitable manner in one or more embodiments. In the following description, specific details are provided in order to give a thorough understanding of the embodiments of the disclosure.

In the drawings, the thickness of areas and layers may be exaggerated for clarity. The same reference numerals in the drawings denote the same or similar structures, and thus their detailed descriptions may be omitted.

The described features, structures, or characteristics may be combined in any suitable manner in one or more embodiments. In the following description, specific details are provided in order to give a thorough understanding of the embodiments of the disclosure. However, those skilled in the art will appreciate that the technical solutions of the disclosure may be practiced without one or more of the specific details, or may be practiced with other manners, components, materials, and the like. Also, well-known structures, materials, or operations are not shown or described in detail to avoid obscuring the main technical idea of the disclosure.

The terms "a", "an", "the" are used to indicate the presence of one or more elements/components/and the like; the terms "including" and "having" are used to indicate an open-ended inclusive meaning and refer to possible presence of additional elements/components/and the like in addition to the elements/components/and the like as listed. The terms "first", "second" and the like are used only as labels and are not intended to limit the number of related elements.

Figure 2:
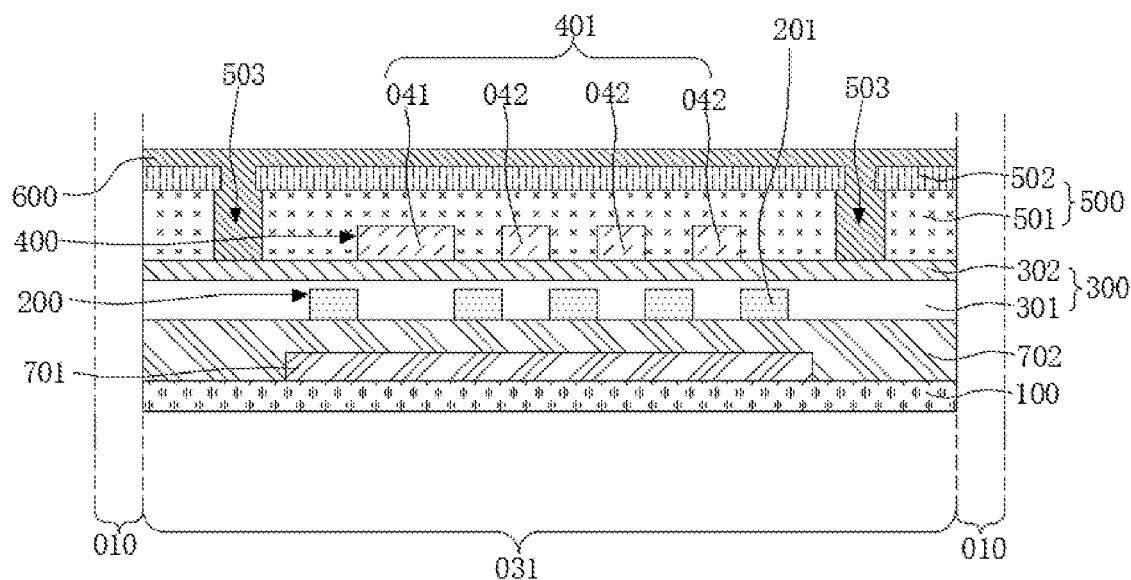
FIG. 2 is a schematic structural diagram illustrating a source-drain bridging area of a flexible array substrate according to some embodiments of the disclosure.
Figure 3:
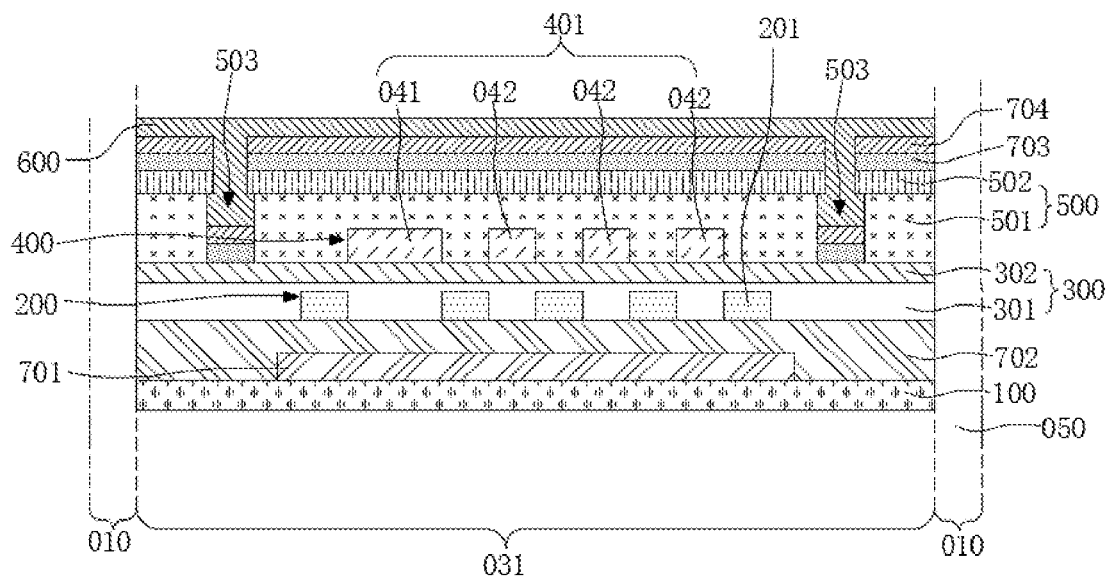
FIG. 3 is a schematic structural diagram illustrating a source-drain bridging area of a flexible array substrate according to some embodiments of the disclosure.
Figure 6:
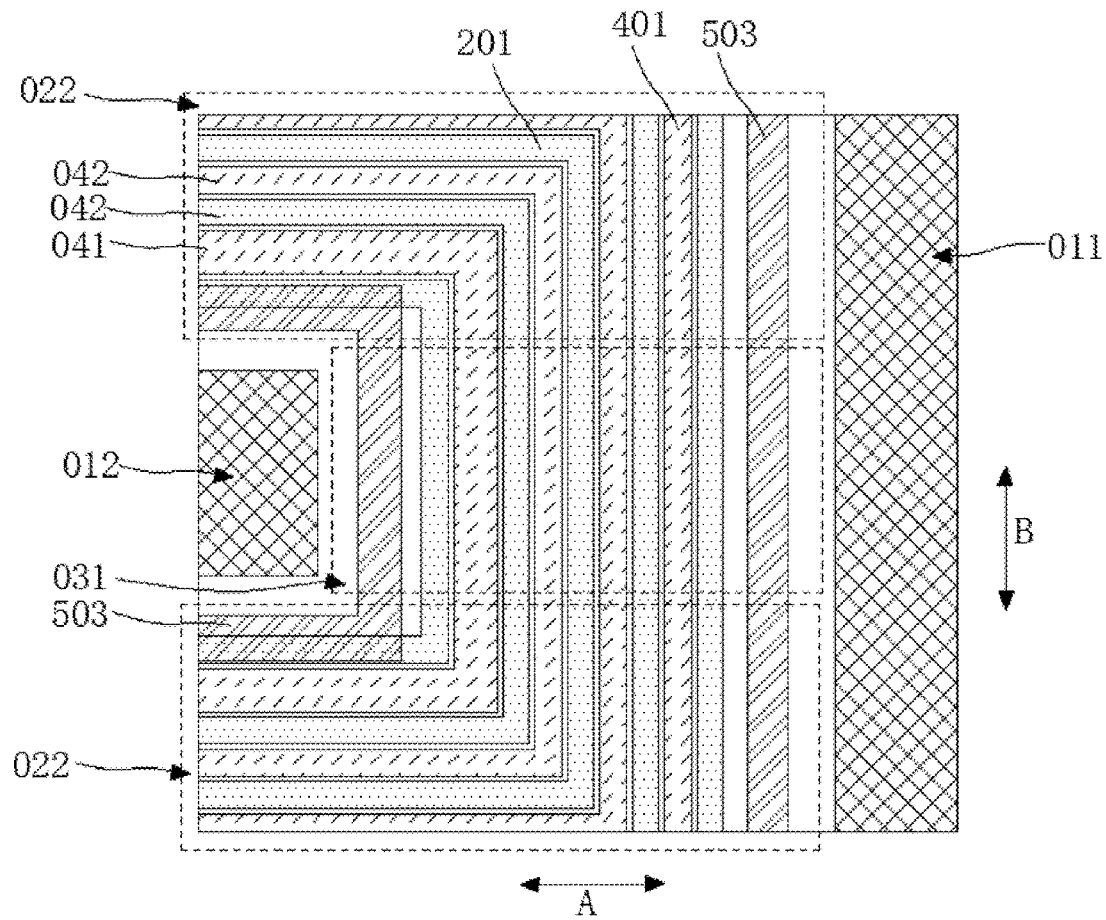
FIG. 6 is a schematic top-view structure diagram illustrating a source-drain bridging area of a flexible array substrate according to some embodiments of the disclosure, where
Figure 12:
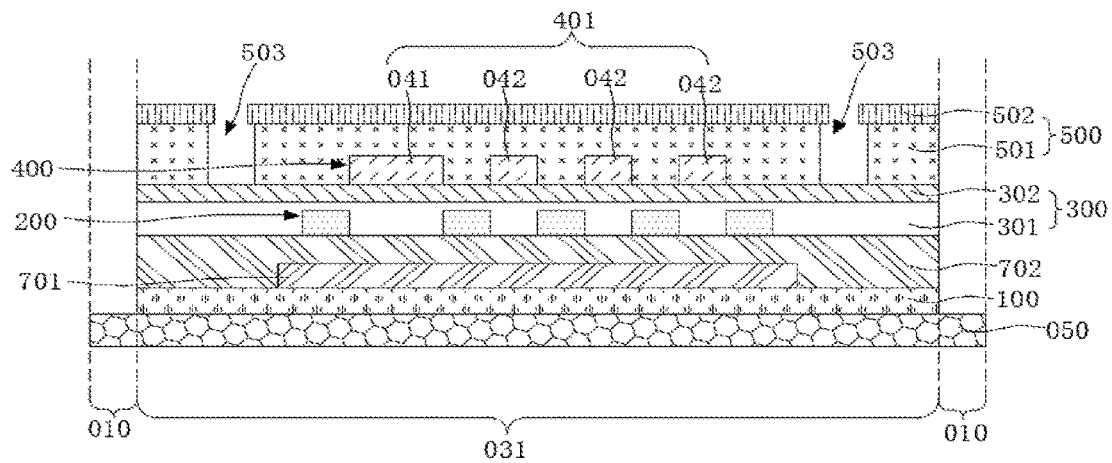
FIG. 12 is a schematic structural diagram of forming an isolation groove in a source-drain bridging area according to some embodiments of the disclosure.

The disclosure provides a flexible array substrate, the flexible array substrate includes at least one stretchable region. As shown in FIG. 1, the flexible array substrate is provided with a plurality of through holes 010 in the stretchable region, and the plurality of through holes 010 divide the stretchable region into pixel island areas 020 for display and bridging areas 030 for signal transmission. The bridging area 030 includes a source-drain bridging area 031. As shown in FIG. 2 and FIG. 3, the flexible array substrate includes, in any one of the source-drain bridging areas 031, a base substrate 100, a first source-drain metal layer 200, a first insulating material layer 300, a second source-drain metal layer 400, a second insulating material layer 500 and an encapsulation layer 600. The first source-drain metal layer 200 is provided on one side of the base substrate 100 and includes a plurality of first source-drain leads 201. The first insulating material layer 300 is provided on one side of the first source-drain metal layer 200 away from the base substrate 100. The second source-drain metal layer 400 is provided on one side of the first insulating material layer 300 away from the base substrate 100. The second source-drain metal layer 400 includes a plurality of second source-drain leads 401, and the number of the second source-drain leads 401 is less than the number of the first source-drain leads 201. The second insulating material layer 500 is provided on one side of the second source-drain metal layer 400 away from the base substrate 100. Referring to FIG. 6 and FIG. 12, the second insulating material layer 500 is provided with a plurality of isolation grooves 503 (filled by the encapsulation layer 600 in FIG. 2 and FIG. 3), and the orthographic projection of the isolation grooves 503 on the second source-drain metal layer 400 isolates the second source-drain leads 401 and the through holes 010. The encapsulation layer 600 is provided on one side of the second insulating material layer 500 away from the base substrate 100.

In the flexible array substrate according to the disclosure, two source-drain metal layers are provided in the source-drain bridging area 031, which can increase the width of each source-drain lead 040 and the distance between adjacent source-drain leads 040 formed by the source-drain metal layers, and reduce the interference between the source-drain leads 040 as well as the impedance of the source-drain leads 040, thereby improving the bendability of the source-drain leads 040, and further improving the stretchability and electrical stability of the stretchable region. In addition, the number of the second source-drain leads 401 is less than that of the first source-drain leads 201, so that the distance between the second source-drain lead 401 and the isolation groove 503 can be increased, thereby reducing the risk of moisture invading the second source-drain lead 401 through the isolation groove 503, improving the encapsulation reliability of the stretchable region, and further improving the electrical stability of the stretchable region.

In the disclosure, the width of a structure in the source-drain bridging area 031 refers to a size of the orthographic projection of this structure on the base substrate 100, falling within the plane of the base substrate 100 and extending along a direction perpendicular to the extending direction of the source-drain leads 040. For example, the width of the source-drain lead refers to a size of the orthographic projection of the source-drain lead 040 in the source-drain bridging area 031 on the base substrate 100, falling within the plane of the base substrate 100 and extending along a direction perpendicular to the extending direction of the source-drain lead 040. For another example, the width of the isolation groove 503 refers to a size of the orthographic projection of the isolation groove 503 in the source-drain bridging area 031 on the base substrate 100, falling within the plane of the base substrate 100 and extending along a direction perpendicular to the extending direction of the source-drain leads 040.

Hereinafter, the structure, principle and effect of the flexible array substrate provided by the disclosure will be further explained and described with reference to the accompanying drawings.

The flexible array substrate provided by the disclosure has at least one stretchable region, and the stretchable region can adapt to a curved surface through being stretched and deformed, and can still achieve a display function after being stretched. The stretchable region may be located in a local area such as the edge and corner of the flexible array substrate, or may cover the entire display area of the flexible array substrate, which is not specifically limited in the disclosure. For example, in some embodiments of the disclosure, the flexible array substrate may have four stretchable regions located at four corners of the flexible array substrate. In this way, the flexible array substrate can be applied to a four-side curved display. For another example, in some other embodiments of the disclosure, the stretchable region of the flexible array substrate covers at least the display area of the flexible array substrate. In other words, the display area of the flexible array substrate is stretchable. In this way, the flexible array substrate can be used to prepare a head-mounted display helmet.

In the stretchable region, as shown in FIG. 1, the flexible array substrate is provided with a plurality of through holes 010 to improve the stretchability of the stretchable region. The through holes 010 divide the stretchable region into island bridge areas connected with each other. The island bridge areas include pixel island areas 020 for display and bridging areas 030 for signal transmission. Adjacent pixel island areas 020 are connected through the bridging areas 030. The shape and arrangement of the through holes 010 may be selected and determined as required, which may be, for example, H-shaped holes, strip holes or through holes 010 of other shapes. The flexible array substrate is also provided with isolation grooves 503, which are provided around respective through holes 010, so as to block the passage of water and oxygen invading from the through holes 010 to the island bridge areas, thereby achieving the protection of the pixel island areas 020 and the bridging areas 030.

Optionally, the through hole 010 may be a strip hole. Referring to FIG. 1, the through holes 010 include first strip holes 011 extending along the row direction A and second strip holes 012 extending along the column direction B. There is one second strip hole 012 provided between two adjacent first strip holes 011 in the same row, and the first strip holes 011 in two adjacent rows are staggered (non-aligned). There is one first strip hole 011 provided between two adjacent second strip holes 012 in the same column, and the second strip holes 012 in two adjacent columns are staggered (non-aligned). In this way, each pixel island area 020 has two first strip holes 011 and two second strip holes 012 around it, where each first strip hole 011 is used to divide the pixel island areas 020 in two adjacent columns, and each second strip hole 012 is used to divide the pixel island areas 020 in two adjacent rows. The bridging area 030 includes a gate bridging area 032 and a source-drain bridging area 031, where the gate bridging area 032 is located between the (lengthwise) side of the first strip hole 011 and the (widthwise) end of the second strip hole 012, and is used to connect two pixel island areas 020 adjacent in the same row. The source-drain bridging area 031 is located between the (widthwise) end of the first strip hole 011 and the (lengthwise) side of the second strip hole 012, and is used to connect two pixel island areas 020 adjacent in the same column.

Further, the pixel island area 020 may include a pixel distribution area 021 and two pixel wiring areas 022 on both sides of the pixel distribution area 021. The pixel distribution area 021 may be provided with one or more pixels, and each pixel may include one or more sub-pixels. Optionally, each sub-pixel may be a self-luminous light-emitting element including, for example, OLED (organic electroluminescent diode), micro LED (micro light-emitting diode), and the like. Optionally, each pixel may include multiple sub-pixels of different colors, so as to realize color display by color mixing of the sub-pixels with different colors. For example, in some embodiments of the disclosure, one pixel island area 020 includes four pixels, and each pixel includes one red sub-pixel, one green sub-pixel and one blue sub-pixel. In other words, any one of the pixel island areas 020 is located between two adjacent first strip holes 011 and between two adjacent second strip holes 012; any one of the pixel island areas 020 includes four pixels, and any one of the pixels includes a red sub-pixel, a green sub-pixel and a blue sub-pixel.

Optionally, the size of any sub-pixel along the row direction A is the first size; in the source-drain bridging area 031, the distance between two adjacent second source-drain leads 401 is equal to the second size; and the first size is greater than second size.

As shown in FIG. 1, the pixel wiring area 022 is located on one side of the pixel distribution area 021 close to the first strip hole 011, and is connected to the source-drain bridging area 031 and the gate bridging area 032. In other words, in the pixel island area 020, along the column direction B, the pixel wiring area 022, the pixel distribution area 021, and the pixel wiring area 022 are sequentially provided. In this way, the pixel distribution area 021 gathers respective source-drain leads 040 to the source-drain bridging area 031 through the pixel wiring area 022, and the pixel distribution area 021 gathers respective gate leads to the gate bridging area 032 through the pixel wiring area 022.

Optionally, the gate bridging area 032 may be provided with gate leads, so as to provide the pixel island area 020 with one or more gate signals such as scan signal, enable signal, reset signal, initialization signal, and the like. In some embodiments, the gate leads in the gate bridging area 032 may also be configured to provide pixels in other areas of the flexible array substrate with one or more gate signals such as scan signal, enable signal, reset signal, initialization signal, and the like.

The source-drain bridging area 031 may be provided with a source-drain lead 040, and the source-drain lead 040 includes a first source-drain lead 201 located in the first source-drain metal layer 200 and a second source-drain lead 401 located in the second source-drain metal layer 400. The source-drain leads 040 are configured to provide the pixel island area 020 with data signal and power supply voltage, or used for transmission of sensing signal and the like of the pixel island area 020. In some embodiments, if sub-pixels are also provided in addition to the stretchable region of the flexible array substrate, the source-drain leads 040 of the source-drain bridging area 031 may also be configured to provide pixels in other areas of the flexible array substrate with data signal, power supply voltage, and the like, or may also be used for transmission of sensing signal and the like of pixels in other areas.

Optionally, in the source-drain bridging area 031, the extending direction of the first source-drain lead 201 is parallel or perpendicular to the extending direction of the through hole 010. The extending direction of the second source-drain lead 401 is parallel or perpendicular to the extending direction of the through hole 010. According to some embodiments, in the source-drain bridging area 031, the extending direction of the first source-drain lead 201 and the second source-drain lead 401 is parallel to the extending direction of the second strip hole 012. In other words, in the source-drain bridging area 031, the extending direction of the first source-drain lead 201 and the second source-drain lead 401 is the column direction B.

Optionally, in the pixel wiring area 022, the extending direction of the first source-drain lead 201 and the second source-drain lead 401 is parallel or perpendicular to the extending direction of the through hole 010. In other words, for any one of the first source-drain leads 201 or the second source-drain leads 401 in the pixel wiring area 022, it may extend along the row direction A, or may extend along the column direction B, or may partially extend along the row direction A and partially extend along the column direction B.

In some embodiments of the disclosure, the flexible array substrate is further provided with pixels outside the stretchable region, the source-drain leads 040 of a first part of these pixels do not pass through the stretchable region, and a second part of these pixels may share the source-drain leads 040 with the pixels in the pixel island area 020, and the source-drain leads 040 of a third part of these pixels pass through the source-drain bridging area 031 of the stretchable region without driving the pixels of the pixel island area 020.

As shown in FIG. 1, in the source-drain bridging area 031, the source-drain lead 040 includes a power lead 041 for loading a power supply voltage and a data lead 042 for loading a data signal. Herein, only one power lead 041 and one data lead 042 are exemplarily illustrated in FIG. 1, but it is only used to illustrate the presence of the power lead 041 and the data lead 042, rather than limiting the number of the power lead 041 and the data lead 042.

Optionally, in one source-drain bridging area 031, only one power lead 041 may be provided, and the power lead 041 may provide power supply voltage to each sub-pixel in the pixel island area 020 in the bridging manner or the like. In this way, the number of source-drain leads 040 in the source-drain bridging area 031 can be reduced, thereby facilitating the improvement of the distance between the source-drain leads 040 and the width of the source-drain leads 040, thereby improving the bendability of the source-drain leads 040 and further improving the stretchability and electrical stability of the stretchable region. In addition, since the number of the source-drain leads 040 is reduced, the distance between the source-drain leads 040 from the through hole 010 and the isolation groove 503 can also be made farther, thereby improving the encapsulation reliability of the stretchable region. In particular, the reduction in the number of source-drain leads 040 in the source-drain bridging area 031 facilitates reducing the width of the source-drain bridging area 031 and the area ratio of the source-drain bridging area 031, thereby increasing the size and area ratio of the pixel island area 020, increasing the pixel density or light-emitting area of the flexible array substrate in the stretchable region, and further improving the display effect.

Optionally, the width of the power lead 041 is greater than the width of the data lead 042 to reduce the voltage drop of the power lead 041. Optionally, the width of the power lead 041 is 1.5 to 3 times the width of the data lead 042.

In some embodiments of the disclosure, in each source-drain bridging area 031, the number of power lead 041 is one, and the power lead 041 is a second source-drain lead 401.

Exemplarily, in some embodiments of the disclosure, the pixel island area 020 includes 4 pixels, each pixel includes 3 sub-pixels that emit light independently, and the 3 sub-pixels include a red sub-pixel, a green sub-pixel and a blue sub-pixel. In each source-drain bridging area 031, nine source-drain leads 040 may be provided, including five first source-drain leads 201 and four second source-drain leads 401. One of the nine second source-drain leads 401 is used as the power lead 041 for loading power supply voltage to each sub-pixel in the pixel island area 020; six of the nine second source-drain leads 040 are used as data leads 042 for providing data signals to sub-pixels in the pixel island area 020; and two of the nine second source-drain leads 040 are used as data leads 042 for providing data signals to sub-pixels outside the stretchable region without providing data signals to the sub-pixels in the pixel island area 020. Compared with the solution of providing all the source-drain leads 040 on the same source-drain metal layer, the total wiring width of the source-drain leads 040 can be reduced by 43% based on the embodiments, thereby ensuring encapsulation effect of each source-drain lead 040.

Optionally, in the source-drain bridging area 031, the minimum distance between the orthographic projection of the second source-drain lead 401 on the second insulating material layer 500 and the isolation groove 503 is not less than the distance between two adjacent second source-drain leads 401. In this way, a sufficiently large distance can be ensured between the second source-drain lead 401 and the isolation groove 503, so that it is difficult for moisture to penetrate into the second source-drain lead 401 through the isolation groove 503, thereby avoiding electrical performance degradation of the second source-drain lead 401.

Optionally, in the source-drain bridging area 031, the minimum distance between the orthographic projection of the second source-drain lead 401 on the second insulating material layer 500 and the isolation groove 503 is equal to 1.5 to 2.0 times the distance between two adjacent second source-drain leads 401. For example, in some embodiments of the disclosure, in the source-drain bridging area 031, the distance between two adjacent second source-drain leads 401 is equal to 3 and the minimum distance between the orthographic projection of the second source-drain lead 401 on the second insulation material layer 500 and the isolation groove 503 is equal to 4.5 to 6.0 µm.

Optionally, the width of the isolation groove 503 is not greater than twice the distance between two adjacent second source-drain leads 401. In this way, it can be avoided that the width of the isolation groove 503 is so great that the distance between the second source-drain lead 401 and the isolation groove 503 is limited, and the distance between the second source-drain lead 401 and the isolation groove 503 is ensured to be large enough to prevent the moisture from being easily to penetrate into the second source-drain lead 401 through the isolation groove 503. In addition, by reducing the width of the isolation groove 503, it is convenient to provide multiple isolation grooves 503 to further improve the encapsulation stability of the source-drain bridging area 031.

Optionally, in the source-drain bridging area 031, between the second source-drain lead 401 and its adjacent through hole 010, there are multiple isolation grooves 503, and the distance between two adjacent isolation grooves 503 is not greater than twice the distance between two adjacent second source-drain leads 401. In this way, when multiple isolation grooves 503 are provided on one side of the source-drain bridging area 031, it can avoid that the distance between the isolation grooves 503 is so great that the distance between the second source-drain lead 401 and the isolation groove 503 is limited, so as to ensure that there is a sufficiently large distance between the second source-drain lead 401 and the isolation groove 503, thereby preventing the moisture from being easily to penetrate into the second source-drain lead 401 through the isolation groove 503. In addition, by reducing the distance of the isolation grooves 503, it is also convenient to provide more isolation grooves 503 to further improve the encapsulation stability of the source-drain bridging area 031.

Optionally, in the source-drain bridging area 031, the width of the isolation groove 503 is equal to 0.9-1.1 times the distance between two adjacent second source-drain leads 401. Between the second source-drain lead 401 and its adjacent through hole 010, there are multiple isolation grooves 503, and the distance between two adjacent isolation grooves 503 is equal to 0.9-1.1 times of the distance between two adjacent second source-drain leads 401. In this way, the width of the isolation grooves 503 and the distance between the isolation grooves 503 can be further limited, so that more isolation grooves 503 can be provided in the source-drain bridging area 031 and the distance between the isolation grooves 503 and the second source-drain leads 401 can be further increased, thereby further improving the encapsulation stability of the source-drain bridging area 031 and the electrical performance stability of the source-drain leads 040. For example, in some embodiments of the disclosure, in the source-drain bridging area 031, the distance between two adjacent second source-drain leads 401 is equal to 3 μm, the width of the isolation groove 503 is equal to 2.7-3.3 μm, and the distance between two adjacent isolation grooves 503 on the same side of the source-drain bridging area 031 is equal to 2.7-3.3 μm.

Optionally, in the source-drain bridging area 031, the distance between two adjacent second source-drain leads 401 is not greater than twice the minimum width of the second source-drain leads 401. In this way, it can avoid that the distance between the second source-drain leads 401 is so large that the distance between the second source-drain leads 401 and the isolation groove 503 is limited, thereby ensuring that the distance between the second source-drain leads 401 and the isolation groove 503 is sufficiently large, so as to prevent the moisture from being easily to penetrate into the second source-drain lead 401 through the isolation groove 503. In addition, by reducing the distance between two adjacent second source-drain leads 401, it is also convenient to provide more isolation grooves 503 to further improve the encapsulation stability of the source-drain bridging area 031.

Optionally, in the source-drain bridging area 031, the distance between two adjacent second source-drain leads 401 is equal to 0.9-1.1 times the minimum width of the second source-drain leads 401. For example, in some embodiments of the disclosure, the minimum width of the second source-drain leads 401 is 3 μm, and the distance between two adjacent second source-drain leads 401 is 2.7-3.3 μm.

Alternatively, in some other embodiments of the disclosure, the distance between two adjacent second source-drain leads 401 in the source-drain bridging area 031 may be determined based on the alignment accuracy of the exposure machine during the preparation of the flexible array substrate. Under the condition that the interference of two adjacent second source-drain leads 401 is controllable, the distance between two adjacent second source-drain leads 401 in the source-drain bridging area 031 may be reduced within the scope allowed by the preparation process. Exemplarily, in some embodiments of the disclosure, according to the alignment and exposure precision of the exposure machine, the distance between the second source-drain leads 401 in the source-drain bridging area 031 may be equal to 2-4 μm. Optionally, in the source-drain bridging area 031, the distance between the second source-drain leads 401 may be equal to 3 μm.

Optionally, as shown in FIG. 2 to FIG. 5, in the source-drain bridging area 031, the plurality of second source-drain leads 401 are provided at equal intervals. The minimum distances between two through holes 010 adjacent to the source-drain bridging area 031 and the second source-drain leads 401 in the source-drain bridging area 031 are equal. In this way, in the source-drain bridging area 031, the second source-drain leads 401 of the second source-drain metal layer 400 are provided symmetrically around a center, thereby ensuring sufficient space for providing the isolation grooves 503 on both sides of the source-drain bridging area 031 adjacent to the through hole 010, and further ensuring a sufficiently large distance between each second source-drain lead 401 and the isolation groove 503, so as to prevent the moisture from being easily to penetrate into the second source-drain leads 401 through the isolation groove 503.

Optionally, in the source-drain bridging area 031, the distance between two adjacent first source-drain leads 201 is not greater than the distance between two adjacent second source-drain leads 401. In this way, it can be avoided that the distance between the first source-drain leads 201 is so large that the width of the source-drain bridging area 031 is increased, thereby improving the area ratio of the pixel island area 020 as well as the pixel density or luminous area of the stretchable region.

Optionally, in the source-drain bridging area 031, the distance between two adjacent first source-drain leads 201 is equal to 0.9-1.0 time the distance between two adjacent second source-drain leads 401. For example, in some embodiments of the disclosure, in the source-drain bridging area 031, the distance between two adjacent second source-drain leads 401 is equal to 3 μm, and the distance between two adjacent first source-drain leads 201 is equal to 2.7 to 3.0 μm.

Optionally, as shown in FIG. 6, in the source-drain bridging area 031, the minimum distance between the orthographic projection of the first source-drain lead 201 on the second insulating material layer 500 and the isolation groove 503 is not greater than the minimum distance between the orthographic projection of the second source-drain leads 401 on the second insulating material layer 500 and the isolation groove 503. Since the isolation grooves 503 are formed in the second insulating material layer 500, the first source-drain leads 201 are completely covered by the first insulating material layer 300, and it is difficult for moisture to penetrate into the first source-drain leads 201 through the isolation grooves 503. Therefore, reducing the distance between the first source-drain lead 201 and the isolation groove 503 will not cause the degradation of the electrical performance stability of the first source-drain lead 201. In addition, reducing the distance between the orthographic projection of the first source-drain lead 201 on the second insulating material layer 500 and the isolation groove 503 can also reduce the width of the source-drain bridging area 031, thereby facilitating increase of area ration of the pixel island area 020 and increase of pixel density of the stretchable region.

In some embodiments of the disclosure, as shown in FIG. 6, in the source-drain bridging area 031, the orthographic projection of the first source-drain lead 201 on the second insulating material layer 500 does not overlap the isolation groove 503 at all. In such embodiments, in the source-drain bridging area 031, the orthographic projection of the isolation groove 503 on the first source-drain metal layer 200 is located between the first source-drain lead 201 and the through hole 010, thereby ensuring a sufficient distance between the first source-drain lead 201 and the through hole 010. For example, in the source-drain bridging area 031, the minimum distance between the orthographic projection of the first source-drain lead 201 on the second insulating material layer 500 and the isolation groove 503 is 1.5-2.7 μm, the minimum distance between the orthographic projection of the second source-drain lead 401 on the second insulating material layer 500 and the isolation groove 503 is 4.5-6.0 μm.

Optionally, in the source-drain bridging area 031, the minimum distance between the orthographic projection of the first source-drain lead 201 on the second insulating material layer 500 and the isolation groove 503 is 2.1 μm; and the minimum distance between the orthographic projection of the second source-drain lead 401 on the second insulating material layer 500 and the isolation groove 503 is 5.2 μm. In this way, compared to the minimum distance between the orthographic projection of the first source-drain lead 201 on the second insulating material layer 500 and the isolation groove 503, the minimum distance between the orthographic projection of the second source-drain lead 401 on the second insulating material layer 500 and the isolation groove 503 is increased by 148%, so that the second source-drain leads 401 are farther away from the isolation grooves 503, thereby improving the encapsulation effect of the second source-drain leads 401.

In some embodiments of the disclosure, in the source-drain bridging area 031, the orthographic projection of the first source-drain lead 201 on the second source-drain metal layer 400 is spaced apart from and not overlapped with each second source-drain lead 401. In this way, the parasitic capacitance between the source-drain leads 040 can be reduced, and the interference between the source-drain leads 040 can be reduced.

In some other embodiments of the disclosure, in the source-drain bridging area 031, the orthographic projection of the first source-drain lead 201 on the second insulating material layer 500 at least partially overlaps with the isolation groove 503. In such embodiments, in the source-drain bridging area 031, part of the first source-drain leads 201, for example, the outermost part of the first source-drain leads 201, may be partially located below the isolation groove 503. In this way, the minimum distance between the orthographic projection of the first source-drain lead 201 on the second insulating material layer 500 and the isolation groove 503 is 0 μm, thereby further reducing the width of the source-drain bridging area 031, and improving the area ratio of the pixel island area 020 as well as the pixel density or light-emitting area of the stretchable region.

Optionally, the number of the first source-drain leads 201 is greater than that of the second source-drain leads 401 by 1 or 2. In this way, it is avoided that the number of the first source-drain leads 201 greatly exceeds the number of the second source-drain leads 401, such that the source-drain bridging area 031 is too wide. In some embodiments of the disclosure, the number of the source-drain leads 040 is an even number, and the number of the first source-drain leads 201 is larger than the number of the second source-drain leads 401 by 2. In some other embodiments of the disclosure, the number of the source-drain leads 040 is an odd number, and the number of the first source-drain leads 201 is greater than the number of the second source-drain leads 401 by 1.

Optionally, the width of one end of the isolation groove 503 away from the base substrate 100 is smaller than the width of the other end of the isolation groove 503 close to the base substrate 100. In this way, for a flexible array substrate whose light-emitting element is an organic electroluminescent diode, when the organic light-emitting layer 703 and the common electrode layer 704 of the flexible array substrate are formed by evaporation, the organic light-emitting layer 703 and the common electrode layer 704 are discontinuous at the side wall of the isolation groove 503. Thus, water and oxygen can be prevented from invading the source-drain bridging area 031 and the pixel island area 020 along the interface between the organic light-emitting layer 703 and the second insulating layer, thereby blocking the intrusion route of water and oxygen, and ensuring the encapsulation reliability of the source-drain bridging area 031 and the pixel island area 020.

In some embodiments of the disclosure, as shown in FIG. 2 and FIG. 3, the isolation groove 503 may penetrate through the second insulating material layer 500, so that the isolation groove 503 can more effectively block the intrusion route of water and oxygen, thereby improving the encapsulation reliability of the second source-drain leads 401.

Figure 4:
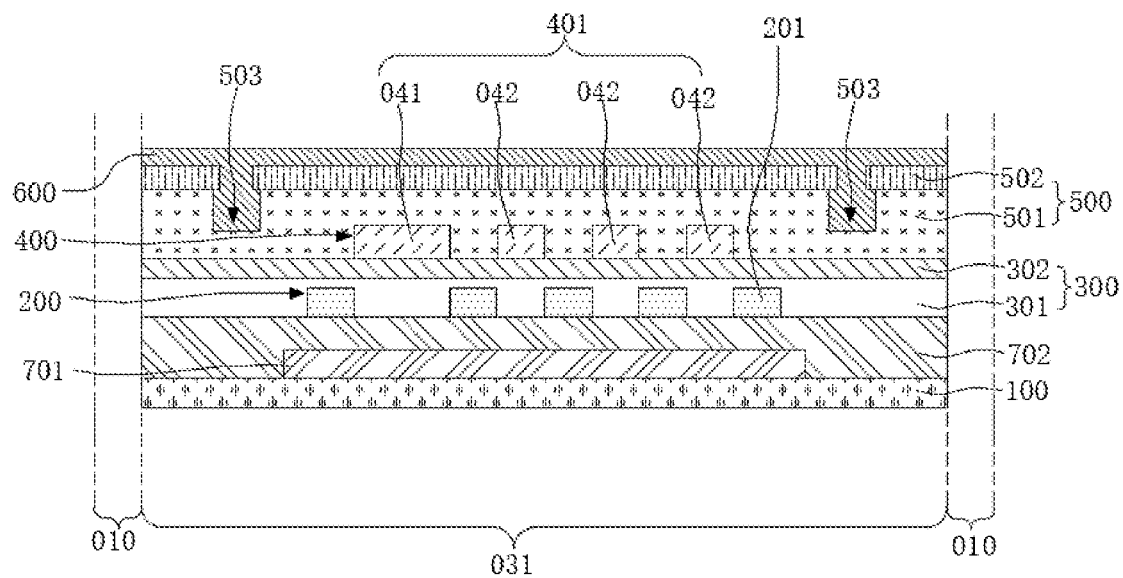
FIG. 4 is a schematic structural diagram illustrating a source-drain bridging area of a flexible array substrate according to some embodiments of the disclosure.
Figure 5:
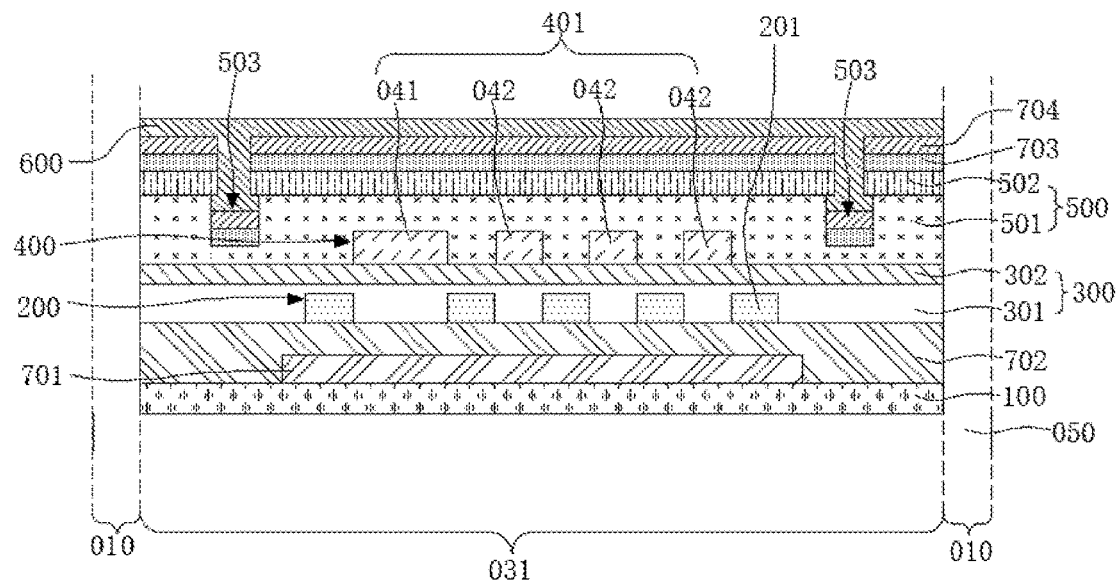
FIG. 5 is a schematic structural diagram illustrating a source-drain bridging area of a flexible array substrate according to some embodiments of the disclosure.

In some other embodiments of the disclosure, as shown in FIG. 4 and FIG. 5, the isolation groove 503 does not penetrate the second insulating material layer 500. In other words, the size of the isolation groove 503 in the direction perpendicular to the base substrate 100 is smaller than that of the second insulating material layer 500 in the direction perpendicular to the base substrate 100. In this way, the first insulating material layer 300 and part of the second insulating material layer 500 are provided between the first source-drain lead 201 and the isolation groove 503, thereby improving the protection effect of the first source-drain lead 201 and preventing moisture from invading the first source-drain lead 201.

Optionally, the base substrate 100 is a flexible base substrate 100, so as to ensure the stretchability of the flexible array substrate. The material of the base substrate 100 may be a flexible material, such as polyimide. The base substrate 100 may also be a composite of multi-layer materials. For example, in some embodiments of the disclosure, the base substrate 100 may include a base film layer, a pressure-sensitive adhesive layer, a first polyimide layer and a second polyimide layer that are stacked in sequence.

Optionally, the first source-drain metal layer 200 may include one layer of conductive material, or may include multiple layers of stacked conductive materials. For example, in some embodiments of the disclosure, the first source-drain metal layer 200 may include a titanium layer, an aluminum layer, and a titanium layer that are sequentially stacked.

Optionally, as shown in FIG. 2 to FIG. 5, the flexible array substrate may further include a shielding layer 701 and a third insulating material layer 702. According to some embodiments, in the source-drain bridging area 031, the shielding layer 701 is provided between the first source-drain metal layer 200 and the base substrate 100, so as to shield light and prevent the external light from irradiating the source-drain leads 040. The third insulating material layer 702 is located between the shielding layer 701 and the first source-drain metal layer 200, and is used for isolating the first source-drain metal layer 200 and the shielding layer 701. In some embodiments of the disclosure, the material of the third insulating material layer 702 may be silicon oxide, silicon nitride, silicon oxynitride or other inorganic insulating materials.

Optionally, as shown in FIG. 2 to FIG. 5, the first insulating material layer 300 includes a first passivation layer 301 and a first planarization layer 302. The first passivation layer 301 covers the surface of the first source-drain metal layer 200 away from the base substrate 100, so as to protect the first source-drain metal layer 200. In some embodiments of the disclosure, the material of the first passivation layer 301 may be silicon oxide, silicon nitride, silicon oxynitride or other dense inorganic insulating materials. The first planarization layer 302 is located on one side of the first passivation layer 301 away from the base substrate 100, and is used for providing a planarized surface for the second source-drain metal layer 400. Moreover, the first planarization layer 302 may be made from an organic insulating material, so as to balance the stress distribution of the first source-drain metal layer 200 and the second source-drain metal layer 400 while providing the planarized surface, so as to improve deformability of the source-drain bridging area 031. In some embodiments of the disclosure, the material of the first planarization layer 302 may include polyimide.

Optionally, the second source-drain metal layer 400 is provided on one side of the first planarization layer 302 away from the base substrate 100, which may include one layer of conductive material, or may include multiple layers of stacked conductive materials. For example, in some embodiments of the disclosure, the second source-drain metal layer 400 may include a titanium layer, an aluminum layer, and another titanium layer that are sequentially stacked. It should be understood that, the materials of the first source-drain metal layer and the second source-drain metal layer 400 may be the same or different, which are not limited in the disclosure.

Optionally, as shown in FIG. 2 to FIG. 5, the second insulating material layer 500 may include a second planarization layer 501 and a second passivation layer 502 that are stacked. The second planarization layer 501 covers one side of the second source-drain metal layer 400 away from the base substrate 100, and the material thereof may be an organic material, such as polyimide. In some embodiments of the disclosure, the second planarization layer 501 may also extend to other areas of the flexible array substrate, for example, extend to the pixel island area 020 of the flexible array substrate, and provide a planarized surface for the pixel electrodes in the pixel island area 020. In some other embodiments of the disclosure, the second planarization layer 501 may also extend to other areas of the flexible array substrate, for example, extend to the pixel island area 020 of the flexible array substrate, and be patterned in the pixel island area 020 as a pixel definition layer. In some embodiments, the second planarization layer 501 may also include multiple stacked organic layers. For example, in some other embodiments of the disclosure, the second planarization layer 501 includes a first organic insulating layer and a second organic insulating layer sequentially stacked on one side of the second source-drain metal layer 400 away from the base substrate 100 layer, where the first organic insulating layer and the second organic insulating layer may extend to other areas of the flexible array substrate, for example, extend to the pixel island area 020 of the flexible array substrate. In this way, the first organic insulating layer may provide a planarized surface for the pixel electrodes in the pixel island area 020, and the second organic insulating layer may be patterned as a pixel definition layer in the pixel island area 020.

The second passivation layer 502 is provided on one side of the second planarization layer 501 away from the base substrate 100, and may be made of silicon nitride, silicon oxynitride, silicon oxide or other inorganic insulating materials. In some embodiments of the disclosure, the second passivation layer 502 serves as a mask layer used for the patterning of the second planarization layer 501.

Exemplarily, the second insulating material layer 500 may be prepared by the following method. Firstly, a second planarization material layer and a second passivation material layer are sequentially formed on one side of the second source-drain metal layer 400 away from the base substrate 100. Then, the second passivation material layer is patterned to be formed with an opening for exposing the second planarization material layer, and the patterned second passivation material layer is used as the second passivation layer 502. Subsequently, the second passivation layer 502 is used as a mask during etching of the second planarization material layer, so as to form grooves on the second planarization material layer, and the patterned second planarization material layer is used as the second planarization layer 501. In this way, the second insulating material layer 500 includes the second planarization layer 501 and the second passivation layer 502 that are stacked, and the grooves of the second planarization layer 501 and the openings of the second passivation layer 502 together form the isolation grooves 503 of second insulating material layer 500.

Moreover, a wet etching process may be used to etch the second planarization material layer, so that the width of the groove on the second planarizing layer 501 is greater than the width of the opening on the second passivation layer 502, thereby making the width of one end of the isolation groove 503 away from the base substrate 100 be smaller than the width of the other end of the isolation groove 503 close to the base substrate 100, or making the second passivation layer 502 be not supported by the second planarization layer 501 near the opening.

Optionally, before forming the second passivation layer 502, a complete and unopened initial base substrate may be used to prepare the flexible array substrate. During the process of forming the isolation grooves 503, or after forming the isolation grooves 503, the flexible array substrate may be formed with through holes 010, so that the initial flexible array substrate is also patterned to form the base substrate 100 of the flexible array substrate.

Optionally, the light-emitting elements of the flexible array substrate may be organic electroluminescent diodes. In order to facilitate the preparation of organic electroluminescent diodes, an open mask evaporation may be applied to all or part of the material of the organic light-emitting layer and the material of the common electrode layer, so as to form the organic light-emitting layer 703 and the common electrode layer 704. During the evaporation process, the material of the organic light-emitting layer and the material of the common electrode layer are discontinuous at the sidewall of the isolation groove 503, thereby avoiding formation of continuous intrusion route of water and oxygen.

In other words, according to some embodiments, as shown in FIG. 3 and FIG. 5, in the source-drain bridging area 031, the flexible array substrate may further include the organic light-emitting layer 703 and the common electrode layer 704 stacked on one side of the second insulating material layer 500 away from the base substrate 100, and the organic light-emitting layer 703 and the common electrode layer 704 are discontinuous at the position of the isolation groove 503. The encapsulation layer 600 may be provided on the surface of the common electrode layer 704 away from the base substrate 100.

Optionally, the encapsulation layer 600 may be a thin film encapsulation layer 600, which may include inorganic material layers and organic material layers that are alternately provided.

Exemplarily, the preparation method of the flexible array substrate may include the following steps.

Figure 7:
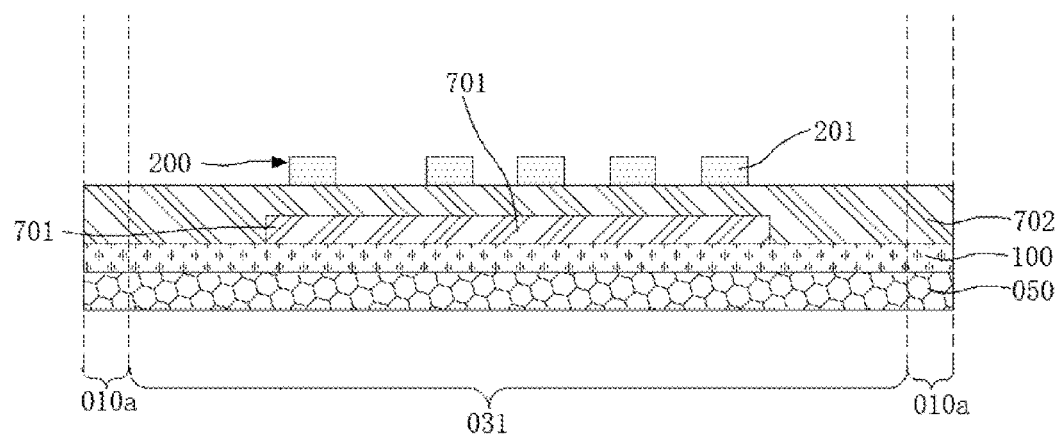
FIG. 7 is a schematic structural diagram of forming a first source-drain lead in a source-drain bridging area according to some embodiments of the disclosure.

In step S110, as shown in FIG. 7, the flexible base substrate 100 is provided on the support substrate 050. The first source-drain metal layer 200 is formed on one side of the base substrate 100 away from the support substrate 050, and the first source-drain metal layer 200 includes a plurality of first source-drain leads 201 in the source-drain bridging area 031. Optionally, the supporting substrate 050 may be a glass substrate.

Figure 8:
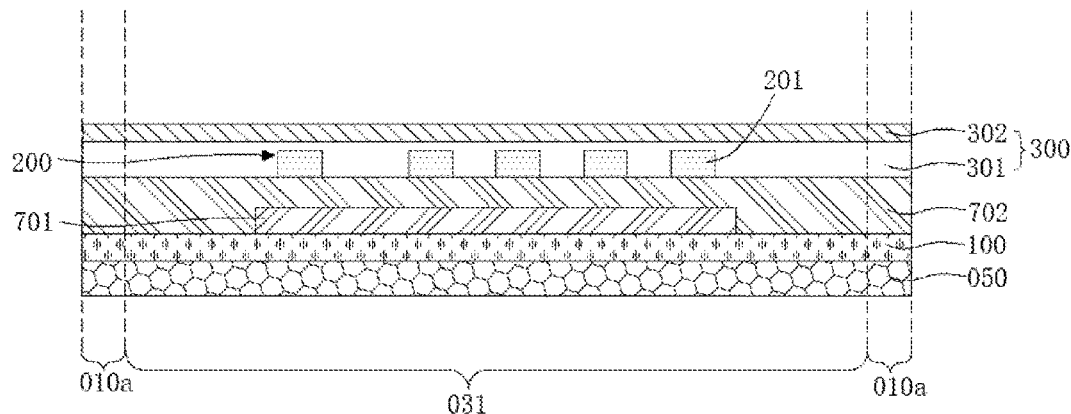
FIG. 8 is a schematic structural diagram of forming a first insulating material layer in a source-drain bridging area according to some embodiments of the disclosure.

In step S120, as shown in FIG. 8, the first insulating material layer 300 is formed on one side of the first source-drain metal layer 200 away from the base substrate 100, and the first insulating material layer 300 covers each of the first source-drain leads 201 in the source-drain bridging area 031.

Figure 9:
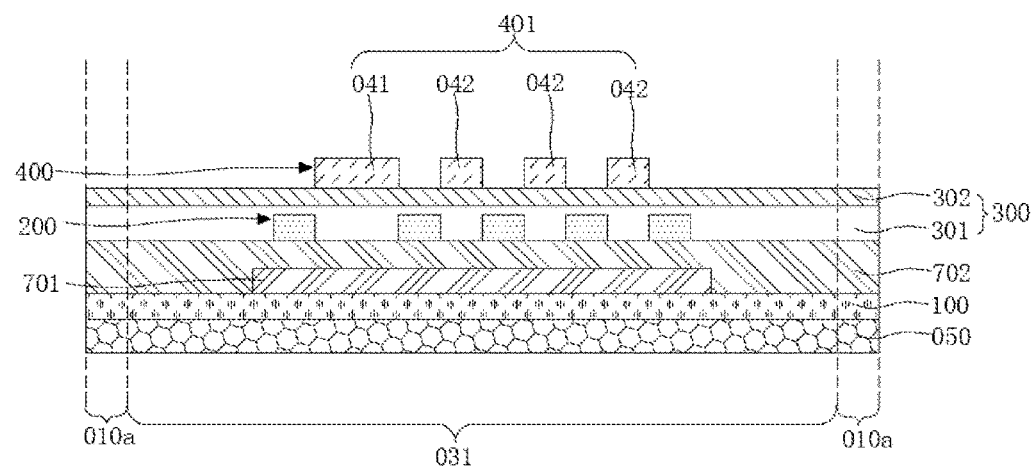
FIG. 9 is a schematic structural diagram of forming a second source-drain lead in a source-drain bridging area according to some embodiments of the disclosure.

In step S130, as shown in FIG. 9, the second source-drain metal layer 400 is formed on one side of the first insulating material layer 300 away from the base substrate 100. In the source-drain bridging area 031, the second source-drain metal layer 400 includes multiple second source-drain leads 401, and the number of the second source-drain leads 401 is less than the number of the first source-drain leads 201.

Figure 10:
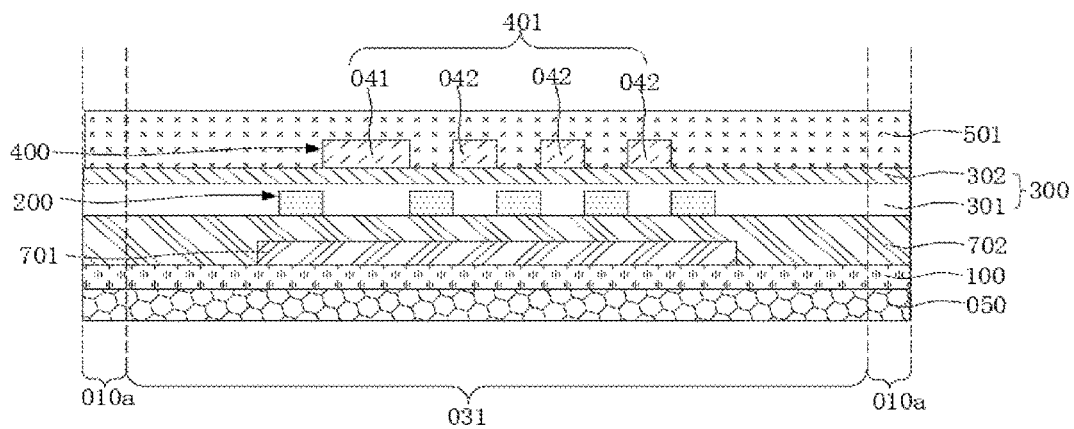
FIG. 10 is a schematic structural diagram of forming a second planarization layer in a source-drain bridging area according to some embodiments of the disclosure.
Figure 11:
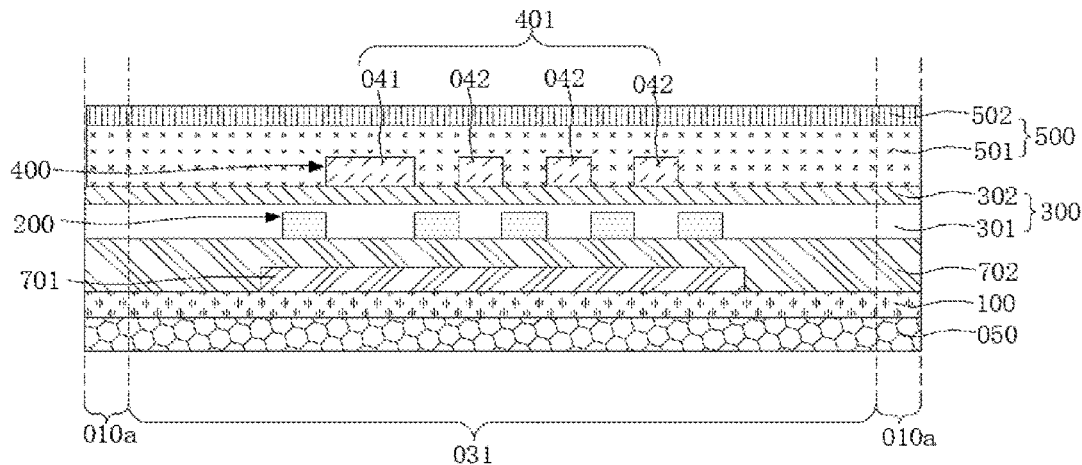
FIG. 11 is a schematic structural diagram of forming a second passivation layer in a source-drain bridging area according to some embodiments of the disclosure.

In step S140, as shown in FIG. 10 and FIG. 11, the second planarization layer 501 and the second passivation layer 502 are sequentially formed on one side of the second source-drain metal layer 400 away from the base substrate 100, and then the second insulating material layer 500 is formed in the source-drain bridging area 031 to cover each of the second source-drain leads 401.

In step S150, as shown in FIG. 12, the second insulating material layer 500 is patterned to form at least two isolation grooves 503. In the source-drain bridging area 031, the orthographic projection of the isolation grooves 503 on the second source-drain metal layer 400 isolates the second source-drain lead 401 and the opening areas 010a on both sides of the source-drain bridging area 031.

Optionally, when forming the isolation groove 503, the opening area 010a may also be opened to form the through hole 010 in the opening area 010a.

Figure 13:
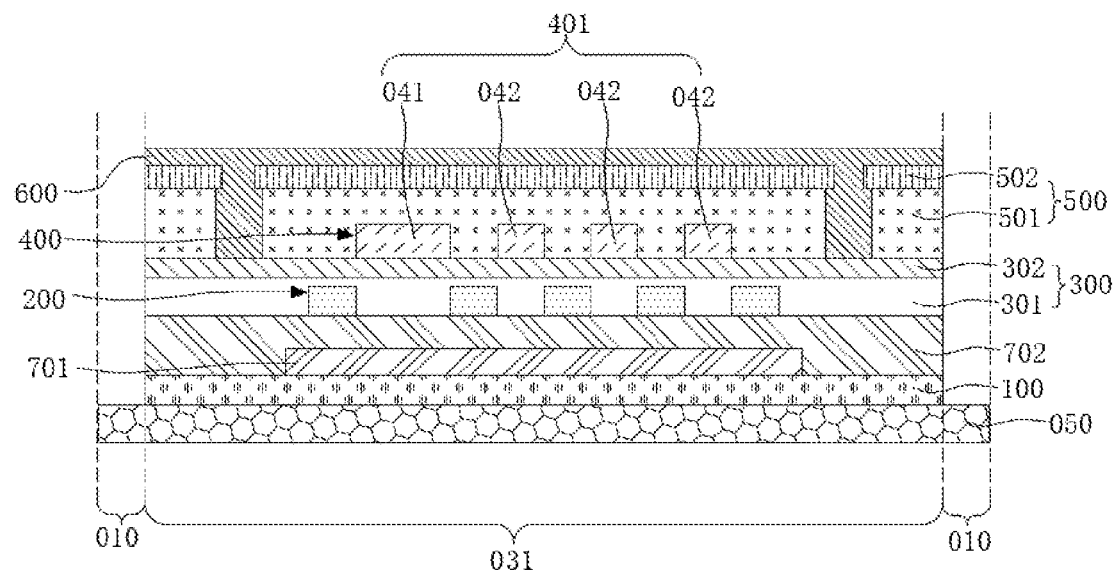
FIG. 13 is a schematic structural diagram of forming an encapsulation layer in a source-drain bridging area according to some embodiments of the disclosure.

In step S160, as shown in FIG. 13, the encapsulation layer 600 is formed on one side of the second insulating material layer 500 away from the base substrate 100.

In step S170, the support substrate 050 is peeled off.

Figure 14:
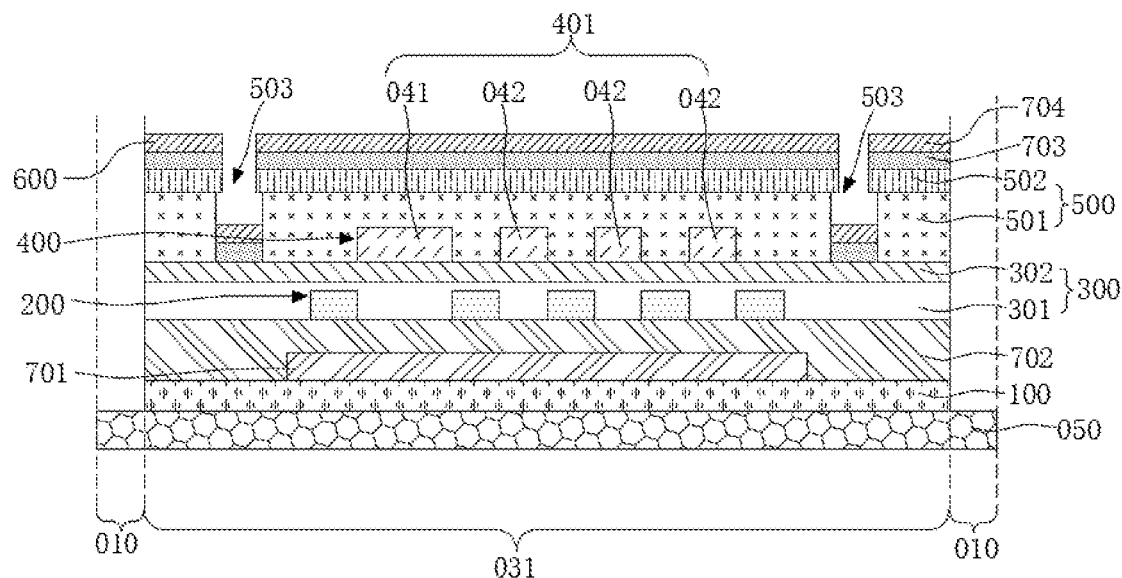
FIG. 14 is a schematic structural diagram of forming an organic light-emitting layer and a common electrode layer in a source-drain bridging area according to some embodiments of the disclosure.
Figure 15:
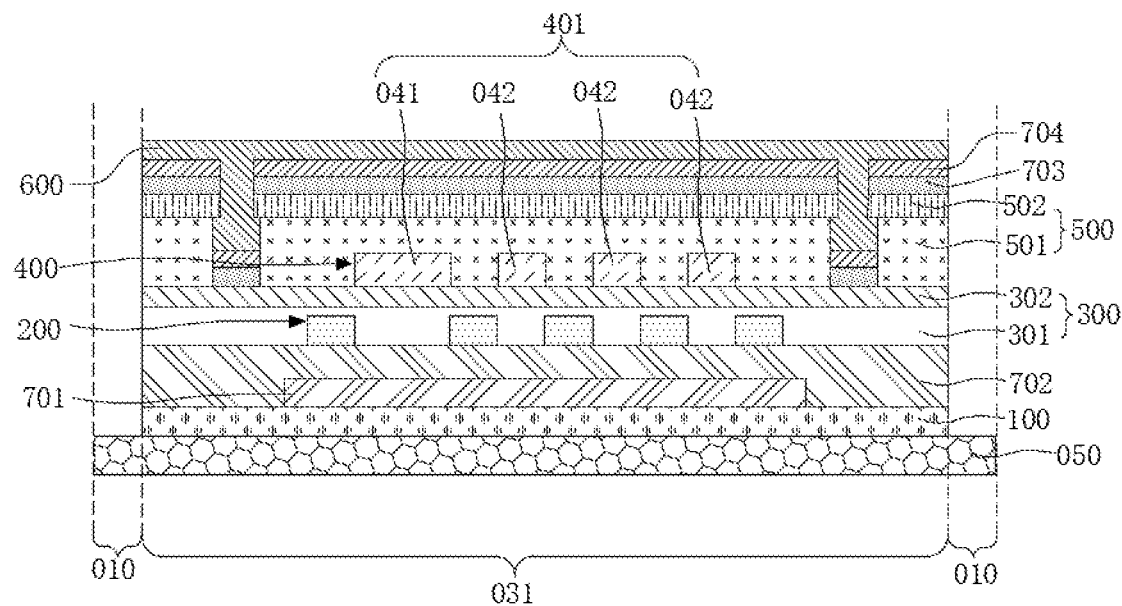
FIG. 15 is a schematic structural diagram of forming an encapsulation layer in a source-drain bridging area according to some embodiments of the disclosure.

In some embodiments, as shown in FIG. 14, after the isolation grooves 503 are formed, the organic light-emitting layer 703 and the common electrode layer 704 may further be formed. The organic light-emitting layer 703 and the common electrode layer 704 are discontinuous at the isolation groove 503. As shown in FIG. 15, after the organic light-emitting layer 703 and the common electrode layer 704 are formed, the encapsulation layer 600 may further be formed on one side of the common electrode layer 704 away from the base substrate 100.

In the following, an exemplary structure of the pixel island area 020 is described, so as to exemplarily show the connection between respective source-drain leads 040 of the source-drain bridging area 031 and the pixel island area 020, thereby explaining and illustrating the structure of the source-drain bridging area 031 more clearly.

In an example of the pixel island area, the pixel island area 020 includes four pixels, with each pixel including three sub-pixels such as a red sub-pixel, a green sub-pixel and a blue sub-pixel, and each sub-pixel including a pixel driving circuit and a pixel electrode connected to the pixel driving circuit.

Figure 27:
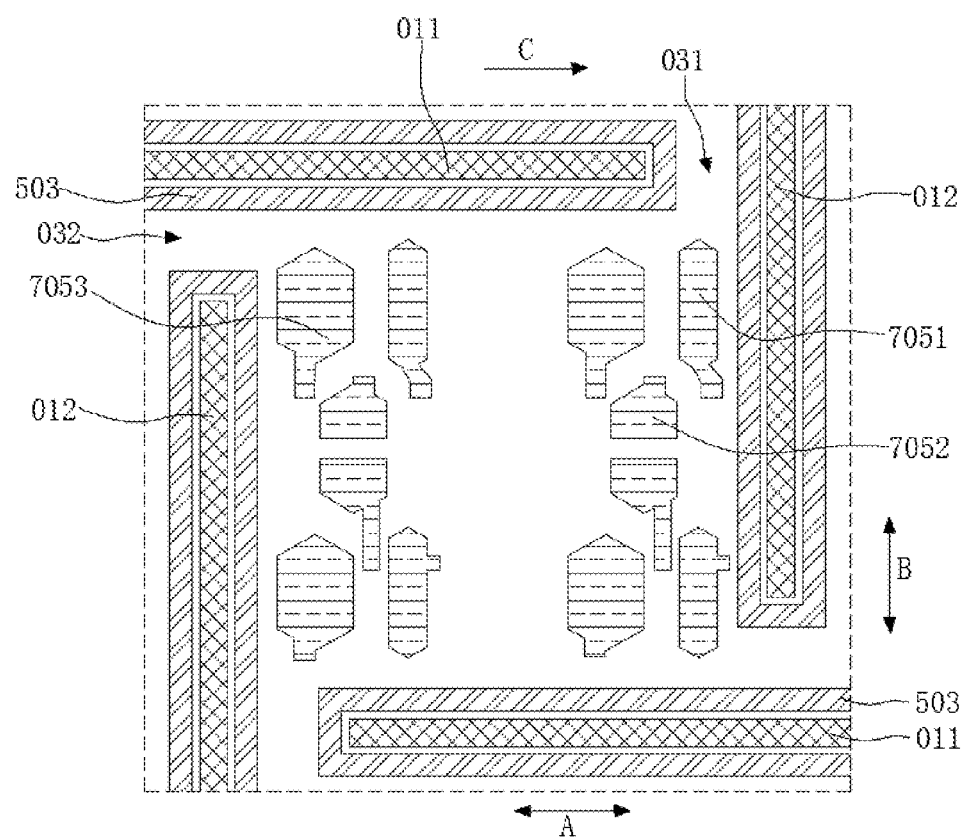
FIG. 27 is a schematic structural diagram of a pixel electrode layer in a stretchable region according to some embodiments of the disclosure.

Two pixel rows are formed by the four pixels, with each pixel row including two pixels arranged along the row direction A. As shown in FIG. 27, in each pixel row, the pixel electrode 7053 of the blue sub-pixel and the pixel electrode 7051 of the red sub-pixel are arranged along the row direction A, and are located on one side of the pixel electrode 7052 of the green sub-pixel away from another pixel row. In this way, two pixel rows are formed with four pixel electrode rows, each one of two pixel electrode rows in the middle includes two pixel electrodes 7052 of green sub-pixels arranged along the row direction A; and each one of two pixel electrode rows at both sides includes the pixel electrodes 7053 of two blue sub-pixels and the pixel electrodes 7051 of two red sub-pixels arranged along the row direction A.

Two pixel columns are also formed by the four pixels, with each pixel column including two pixels arranged along the row direction B. In each of the pixel columns, the pixel electrodes 7053 of two blue sub-pixels are arranged along the column direction, the pixel electrodes 7051 of two red sub-pixels are arranged along the column direction, and the pixel electrodes 7052 of two green sub-pixels are arranged along the column direction. In each of the pixel columns, the pixel electrode 7051 of the red subpixel is located on one side of the pixel electrode 7053 of the blue subpixel in a preset direction C, and the preset direction C is a direction parallel to the row direction A.

Correspondingly, the pixel island area 020 is provided with twelve pixel driving circuits connected to the twelve pixel electrodes in a one-to-one correspondence, and these pixel driving circuits are provided in two rows, that is, include a first pixel driving circuit row close to the source-drain bridging area 031 and a second pixel driving circuit row far away from the source-drain bridging area 031. These pixel driving circuits are also arranged in six columns, including a first pixel driving circuit column, a second pixel driving circuit column, a third pixel driving circuit column, a fourth pixel driving circuit column, a fifth pixel driving circuit column, and a sixth pixel driving circuit column arranged in sequence along the preset direction C. In some embodiments, the pixel driving circuits in the first and fourth pixel driving circuit columns are connected to the pixel electrodes 7053 of the blue sub-pixels, and the pixel driving circuits in the second and fifth pixel driving circuit columns are connected to the pixel electrodes 7052 of the green sub-pixels, and the pixel driving circuits in the third and sixth pixel driving circuit columns are connected to the pixel electrodes 7051 of the red sub-pixels.

Figure 16:
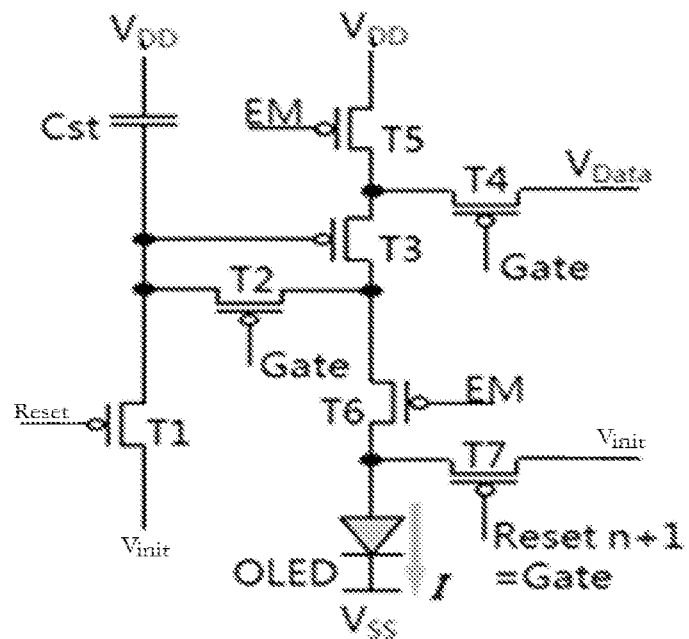
FIG. 16 is an equivalent circuit diagram of a pixel driving circuit according to some embodiments of the disclosure.

In this example, as shown in FIG. 16, any one of the pixel driving circuits may be provided in the structure of 7T1C (7 thin film transistors and 1 storage capacitor Cst). The third thin film transistor T3 is used as a driving transistor, with its first end being electrically connected to a second end of the fifth thin film transistor T5, its second end being electrically connected to a first end of the sixth thin film transistor T6, and its control end being connected to a first electrode plate of the storage capacitor Cst. A first end of the first thin film transistor T1 is configured to load the initial signal (Vinit), a second end thereof is electrically connected to the first electrode plate of the storage capacitor Cst, and the control end thereof is configured to load the reset signal (Reset). A first end of the second thin film transistor T2 is electrically connected to the second end of the third thin film transistor T3, a second end thereof is electrically connected to the first electrode plate of the storage capacitor Cst, and the control end thereof is configured to load the scan signal. A first end of the fourth thin film transistor T4 is configured to load the data signal (Vdata), a second end thereof is electrically connected to the first end of the third thin film transistor T3, and the control end thereof is configured to load the scan signal (Gate). A first end of the fifth thin film transistor T5 is configured to load the power supply voltage (VDD), the second end thereof is electrically connected to the first end of the third thin film transistor T3, and a control end thereof is configured to load the enable signal (EM, Emission). The first end of the sixth thin film transistor T6 is electrically connected to the second end of the third thin film transistor T3, a second end thereof is electrically connected to the pixel electrode, and a control end thereof is configured to load the enable signal (EM, Emission). A first end of the seventh thin film transistor T7 is configured to load the initial signal (Vinit), a second end thereof is electrically connected to the pixel electrode, and a control end thereof is configured to load the reset signal. The first electrode plate of the storage capacitor Cst is electrically connected to the control end of the third thin film transistor T3, and a second electrode plate thereof is configured to load the power supply voltage (VDD).

In this example, the flexible array substrate in the pixel island area 020 may include a base substrate, a semiconductor layer, a first gate insulating layer, a first gate layer, a second gate insulating layer, a second gate layer, an interlayer dielectric layer, a first source-drain metal layer, a first insulating material layer, a second source-drain metal layer, a second planarization layer, a pixel electrode layer, an organic light-emitting layer, a common electrode layer and an encapsulation layer that are stacked in sequence.

Figure 17:
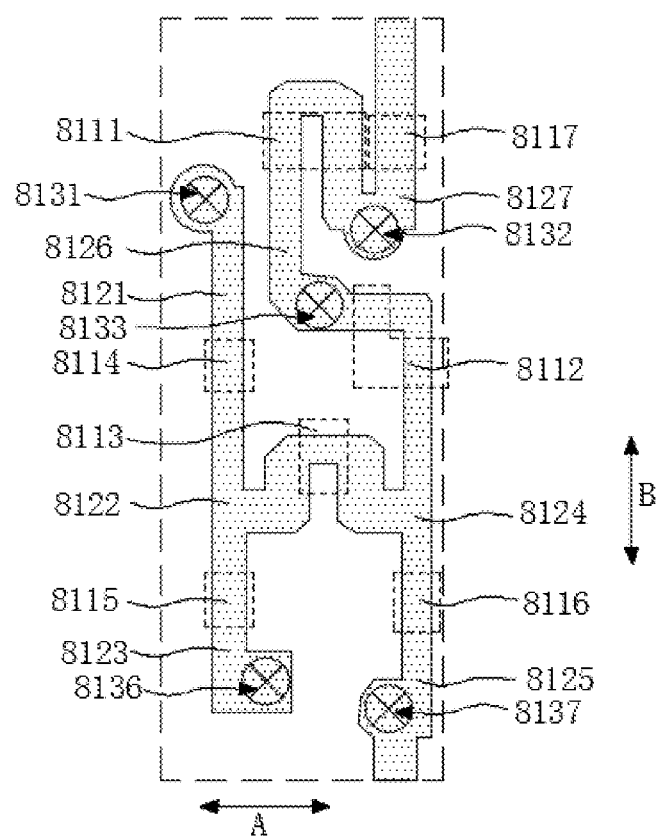
FIG. 17 is a schematic structural diagram of a semiconductor layer of a pixel driving circuit according to some embodiments of the disclosure.
Figure 22:
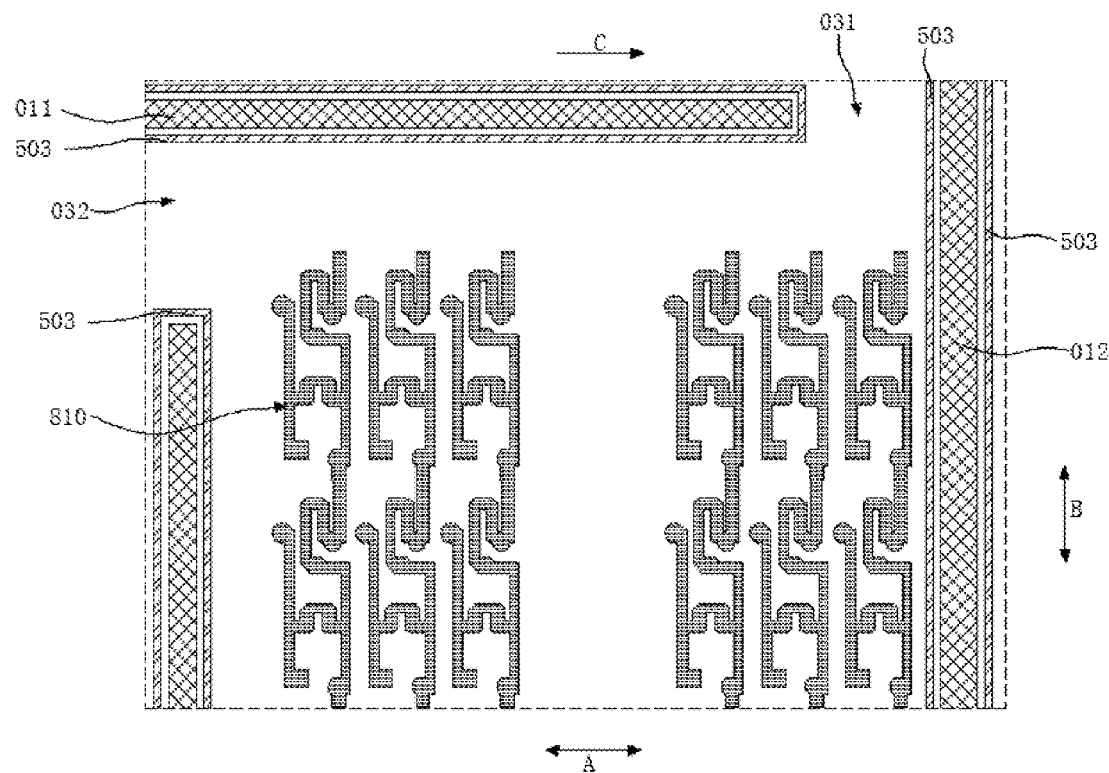
FIG. 22 is a schematic structural diagram of a semiconductor layer in a stretchable region according to some embodiments of the disclosure.

The material of the semiconductor layer may be polysilicon, the conductivity of which may vary depending on different positions through processes such as doping, thereby forming multiple channel areas and conductive segments. As shown in FIG. 17 and FIG. 22, in any pixel driving circuit, the semiconductor layer 810 may be formed with a first channel area 8111 serving as a channel area of the first thin film transistor T1, a second channel area 8112 serving as a channel area of the second thin film transistor T2, a third channel area 8113 serving as a channel area of the third thin film transistor T3, a fourth channel area 8114 serving as a channel area of the fourth thin film transistor T4, a fifth channel area 8115 serving as a channel area of fifth thin film transistor T5, a sixth channel area 8116 serving as a channel area of the sixth thin film transistor T6, and a seventh channel area 8117 serving as a channel area of the seventh thin film transistor T7, and may further be formed with a first conductive segment 8121, a second conductive segment 8122, a third conductive segment 8123, a fourth conductive segment 8124, a fifth conductive segment 8125, a sixth conductive segment 8126, and a seventh conductive segment 8127. The first conductive segment 8121 is connected to a first end of the fourth channel area 8114 and is provided with a first semiconductor-layer via area 8131. The second conductive segment 8122 is connected to a second end of the fourth channel area 8114, a first end of the fifth channel area 8115, and a first end of the third channel area 8113. The third conductive segment 8123 is connected to a second end of the fifth channel area 8115, and is provided with a sixth semiconductor-layer via area 8136. The fourth conductive segment 8124 is connected to a second end of the third channel area 8113, a first end of the sixth channel area 8116, and a second end of the second channel area 8112. The fifth conductive segment 8125 is connected to a second end of the sixth channel area 8116, a second end of the seventh channel area 8117 in the next one pixel driving circuit, and a second end of the second channel area 8112, and is provided with a seventh semiconductor-layer via area 8137. The sixth conductive segment 8126 is connected to a first end of the second channel area 8112 and a second end of the first channel area 8111, and is provided with a third semiconductor-layer via area 8133. The seventh conductive segment 8127 is connected to a first end of the first channel area 8111 and a first end of the seventh channel area 8117, and is provided with a second semiconductor-layer via area 8132.

Figure 18:
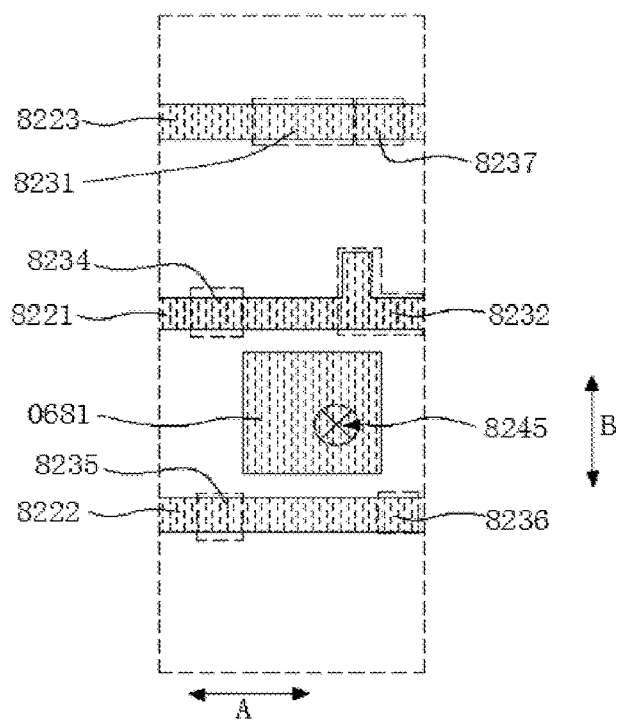
FIG. 18 is a schematic structural diagram of a first gate layer of a pixel driving circuit according to some embodiments of the disclosure.
Figure 23:
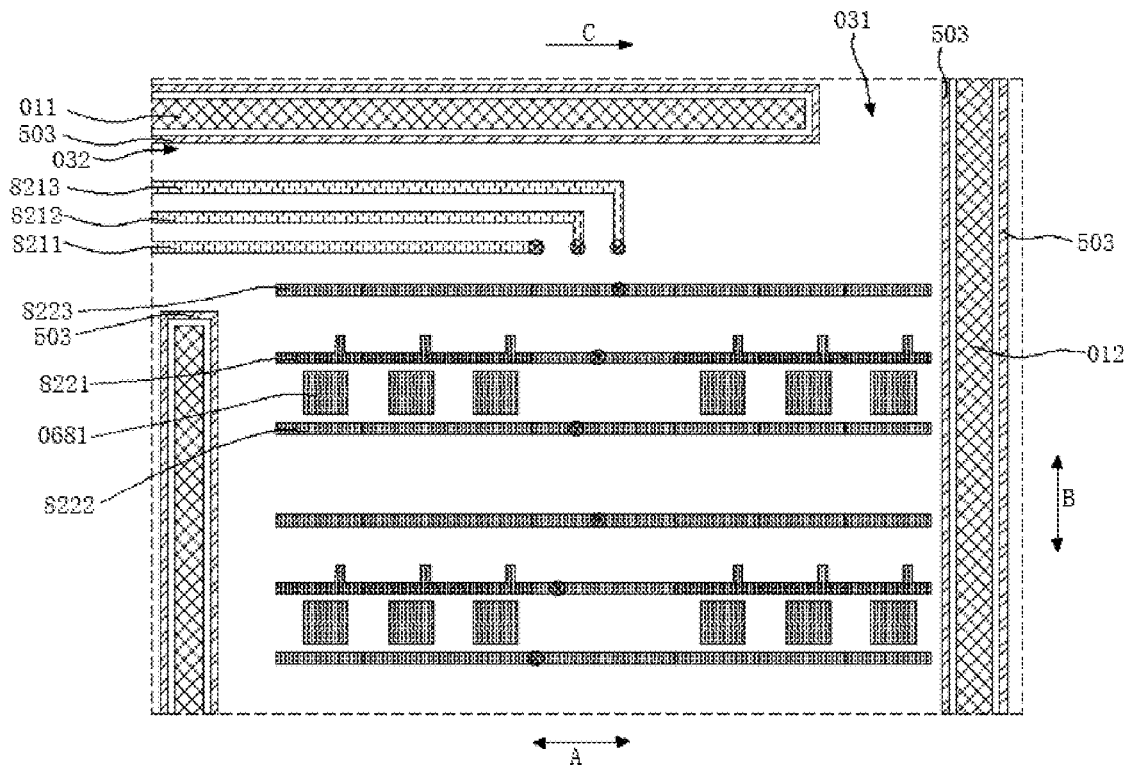
FIG. 23 is a schematic structural diagram of a first gate layer in a stretchable region according to some embodiments of the disclosure.

As shown in FIG. 18 and FIG. 23, the first gate layer may include a first gate lead 8211, a second gate lead 8212, and a third gate lead 8213, as well as a first gate structure of a pixel driving circuit. The first gate lead 8211, the second gate lead 8212, and the third gate lead 8213 pass through the gate bridging area 032 and extend to the pixel wiring area.

As shown in FIG. 18, the first gate structure of the pixel driving circuit includes a scan lead 8221, an enable lead 8222, a reset lead 8223 and a first electrode plate 0681 of a storage capacitor. The reset lead 8223 includes a first lead area 8231 and a seventh lead area 8237. The orthographic projection of the first lead area 8231 on the semiconductor layer 810 coincides with the first channel area 8111, thereby serving as the gate of the first thin film transistor T1. The orthographic projection of the seventh lead area 8237 on the semiconductor layer 810 coincides with the seventh channel area 8117, thereby serving as the gate of the seventh thin film transistor T7. The scanning lead 8221 includes a second lead area 8232 and a fourth lead area 8234. The orthographic projection of the second lead area 8232 on the semiconductor layer 810 coincides with the second channel area 8112, thereby serving as the gate of the second thin film transistor T2. The orthographic projection of the fourth lead area 8234 on the semiconductor layer 810 coincides with the fourth channel area 8114, thereby serving as the gate of the fourth thin film transistor T4. The enable lead 8222 includes a fifth lead area 8235 and a sixth lead area 8236. The orthographic projection of the fifth lead area 8235 on the semiconductor layer 810 coincides with the fifth channel area 8115, thereby serving as the gate of the fifth thin film transistor T5. The orthographic projection of the sixth lead area 8236 on the semiconductor layer 810 coincides with the sixth channel area 8116, thereby serving as the gate of the sixth thin film transistor T6. The orthographic projection of the first electrode plate 0681 of the storage capacitor on the semiconductor layer 810 completely covers the third channel area 8113, so that the first electrode plate 0681 of the storage capacitor may also serve as the gate of the third thin film transistor T3. The first electrode plate 0681 of the storage capacitor is further provided with a fifth gate-layer via area 8245.

Figure 19:
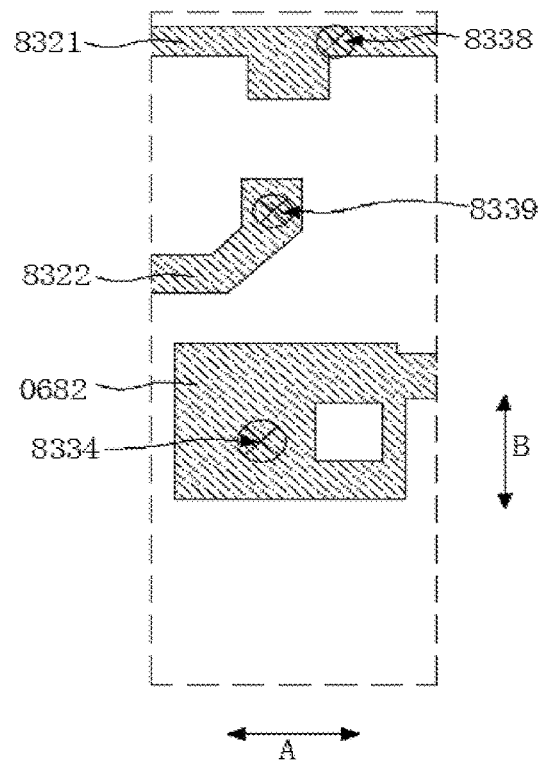
FIG. 19 is a schematic structural diagram of a second gate layer of a pixel driving circuit according to some embodiments of the disclosure.
Figure 24:
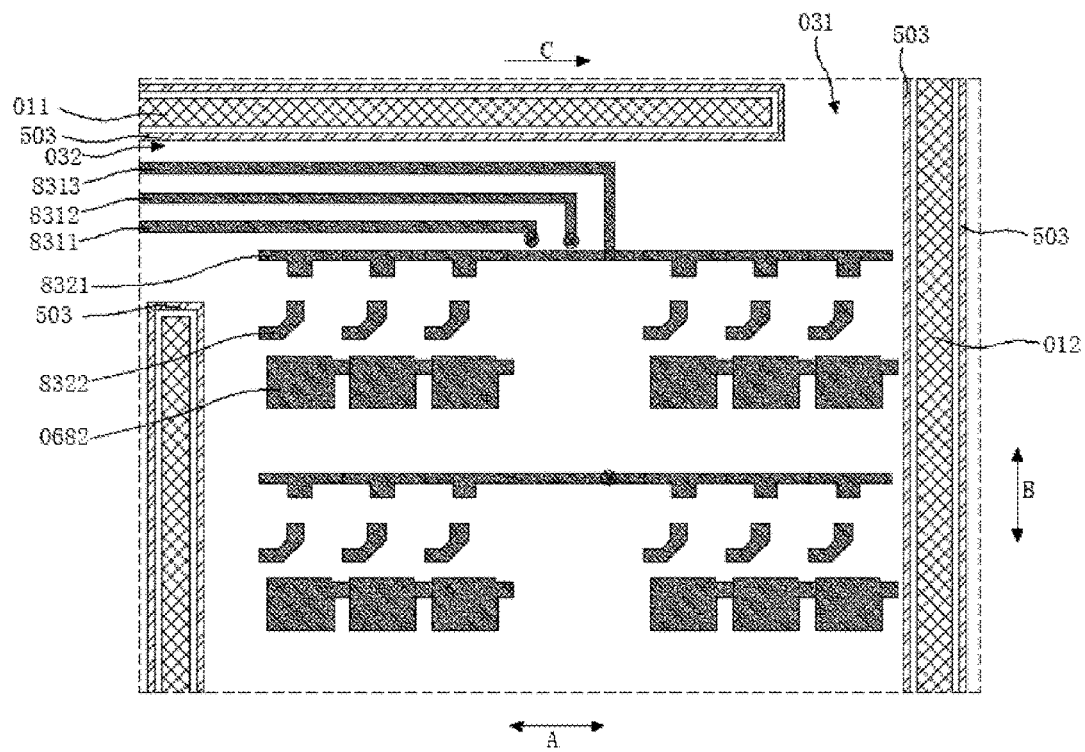
FIG. 24 is a schematic structural diagram of a second gate layer in a stretchable region according to some embodiments of the disclosure.

As shown in FIG. 19 and FIG. 24, the second gate layer may include a fourth gate lead 8311, a fifth gate lead 8312 and a sixth gate lead 8313, as well as a second gate structure of a pixel driving circuit. The fourth gate lead 8311, the fifth gate lead 8312, and the sixth gate lead 8313 pass through the gate bridging area 032 and extend to the pixel wiring area. The second gate structure of the pixel driving circuit includes an initialization lead 8321, an auxiliary electrode plate 8322, and a second electrode plate 0682 of the storage capacitor. Orthographic projections of the second electrode plate 0682 of the storage capacitor and the first electrode plate 0681 of the storage capacitor partially on the base substrate overlap with each other, and the orthographic projection of the fifth gate-layer via area 8245 on the base substrate is located outside the orthographic projection of the second electrode plate 0682 of the storage capacitor on the base substrate. The second electrode plate 0682 of the storage capacitor is provided with a fourth gate-layer via area 8334. The third gate lead 8213 is provided with an eighth gate-layer via area 8338. The auxiliary electrode plate 8322 is used to cover part of the sixth conductive segment 8126 and part of the first conductive segment 8121, and is provided with a ninth gate-layer via area 8339. The sixth gate lead 8313 in the pixel wiring area is connected to the initialization lead 8321 of the pixel driving circuit close to the pixel wiring area.

Figure 20:
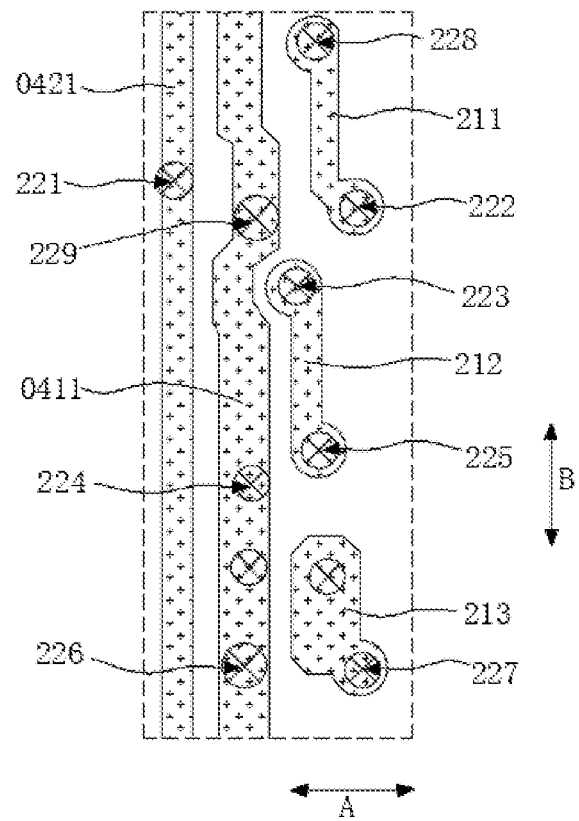
FIG. 20 is a schematic structural diagram of a first source-drain metal layer of a pixel driving circuit according to some embodiments of the disclosure.
Figure 25:
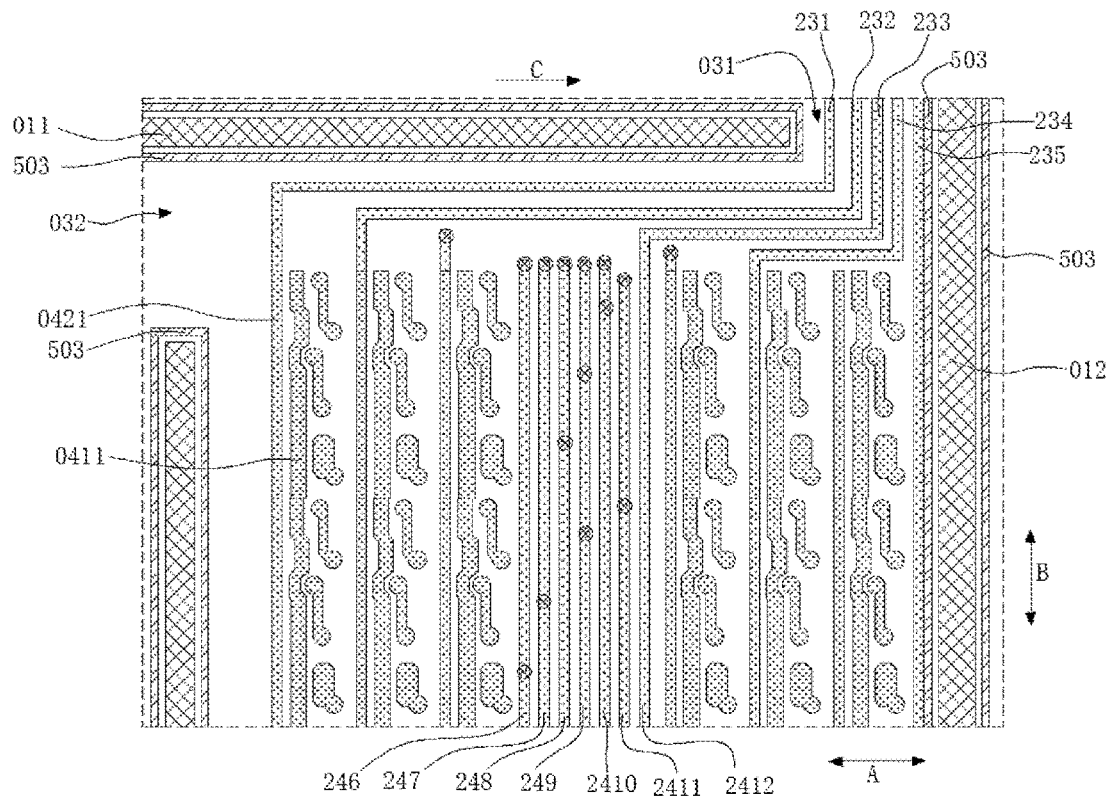
FIG. 25 is a schematic structural diagram of a first source-drain metal layer in a stretchable region according to some embodiments of the disclosure.

As shown in FIG. 20 and FIG. 25, the first source-drain metal layer includes a plurality of source-drain leads and a first source-drain conductive structure of the pixel driving circuit.

As shown in FIG. 20, the first source-drain conductive structure of the pixel driving circuit includes a data lead structure 0421, a power lead structure 0411, a first connection lead 211, a second connection lead 212 and a third connection lead 213. The power lead structure 0411 is provided on one side of the data lead structure 0421 in the preset direction C, and the first connection lead 211, the second connection lead 212 and the third connection lead 213 are provided on one side of the power lead structure 0411 in the preset direction C. The data lead structure 0421 is provided with a first source-drain via area 221, and the first source-drain via area 221 is connected with the first semiconductor-layer via area 8131 to form a first metallization via. The power lead structure 0411 is provided with a fourth source-drain via area 224, a sixth source-drain via area 226 and a ninth source-drain via area 229. The fourth source-drain via area 224 is connected with the fourth gate-layer via area 8334 to form a fourth metallization via, the sixth source-drain via area 226 is connected with the sixth semiconductor-layer via area 8136 to form a sixth metallization via, the ninth source-drain via area 229 is connected with the ninth gate-layer via area 8339 to form a ninth metallization via. The first connection lead 211 is provided with a eighth source-drain via area 228 and a second source-drain via area 222. The eighth source-drain via area 228 is connected with the eighth gate-layer via area 8338 to form an eighth metallization via. The second source-drain via area 222 is connected with the second semiconductor-layer via area 8132 to form a second metallization via. The second connection lead 212 is provided with a third source-drain via area 223 and a fifth source-drain via area 225. The third source-drain via area 223 is connected with the third semiconductor-layer via area 8133 to form a third metallization via area. The fifth source-drain via area 225 is connected with the fifth gate-layer via area 8245 to form a fifth metallization via. The third connection lead 213 is provided with a seventh source-drain via area 227, and the seventh source-drain via area 227 is connected with the seventh semiconductor-layer via area 8137 to form a seventh metallization via.

The source-drain leads located in the first source-drain metal layer include the first source-drain leads 201 of the array substrate and a plurality of wiring leads located in the pixel island area 020. The first source-drain leads 201 include a first metal lead 231, a second metal lead 232, a third metal lead 233, a fourth metal lead 234 and a fifth metal lead 235, which are sequentially provided in the source-drain bridging area 031 along the preset direction C. The first metal lead 231, the second metal lead 232, the third metal lead 233, and the fourth metal lead 234 extend to the pixel wiring area 021. The fifth metal lead 235 passes through the pixel island area at one side of the sixth pixel driving circuit column away from the first pixel driving circuit column. The wiring leads include a sixth metal lead 246 to a twelfth metal lead 2412 located between two pixel columns, with the twelfth metal lead 2412 being connected with the third metal lead 233.

The first metal lead 231 is connected to the data lead structure 0421 of the first pixel driving circuit column, the second metal lead 232 is connected to the data lead structure 0421 of the second pixel driving circuit column, and the fourth metal lead 234 is connected to the data lead structure 0421 of the fifth pixel driving circuit column. The sixth metal lead 246 is connected to the enable lead 8222 of the second pixel driving circuit row through the via hole, and is connected to the first gate lead 8211 through the via hole. The seventh metal lead 247 is connected to the scan lead 8221 of the second pixel driving circuit row through the via hole, and is connected to the fourth gate lead 8311 through the via hole. The eighth metal lead 248 is connected to the enable lead 8222 of the first pixel driving circuit row through the via hole, and is connected to the second gate lead 8212 through the via hole. The ninth metal lead 249 is connected to the scan lead 8221 of the first pixel driving circuit row through the via hole, and is connected to the reset lead 8223 of the second pixel driving circuit row through the via hole, and is connected to the fifth gate lead 8312 through the via hole. The tenth metal lead 2410 is connected to the reset lead 8223 of the first pixel driving circuit row through the via hole, and is connected to the third gate lead 8213 through the via hole. The eleventh metal lead 2411 is connected to the initialization leads 8321 of the first pixel driving circuit row through the via hole, and is connected to the initialization leads 8321 of the second pixel driving circuit row through the via hole.

Figure 21:
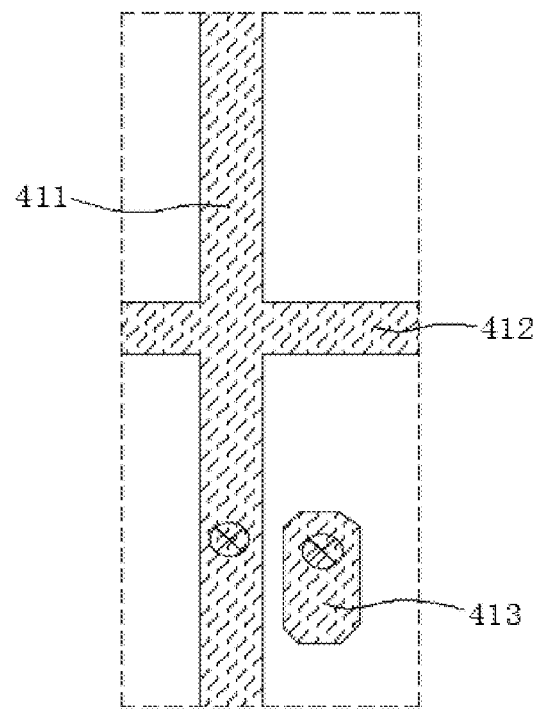
FIG. 21 is a schematic structural diagram of a second source-drain metal layer of a pixel driving circuit according to some embodiments of the disclosure.
Figure 26:
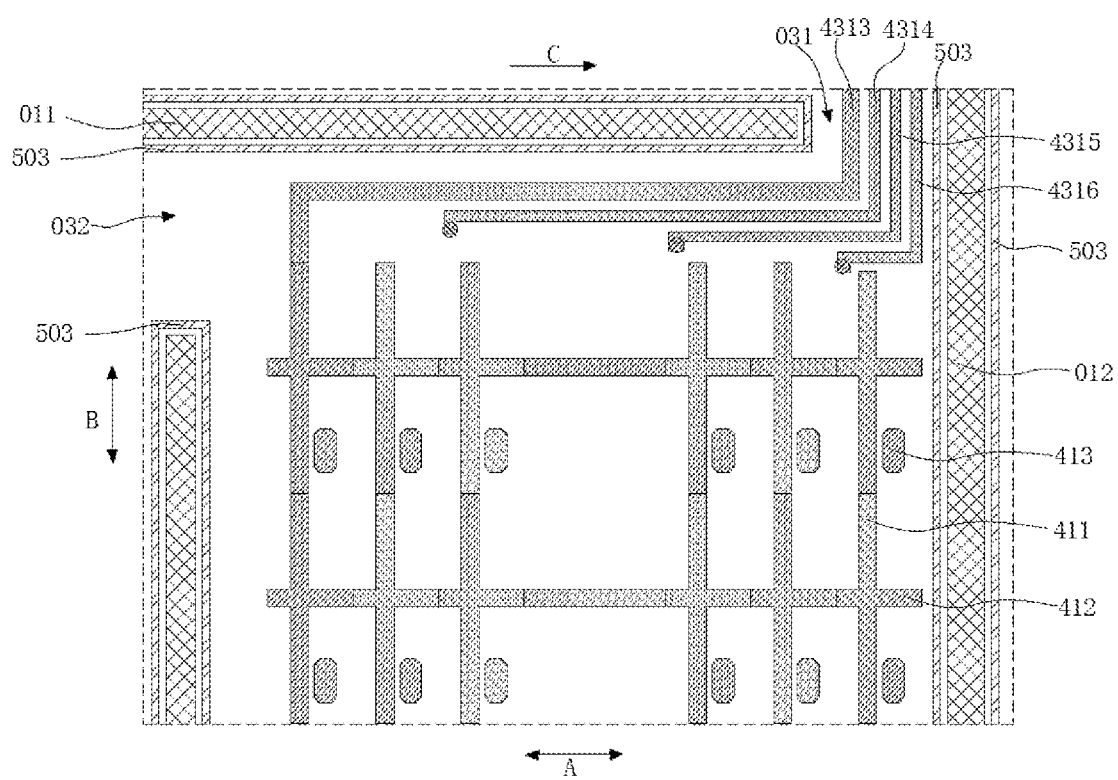
FIG. 26 is a schematic structural diagram of a second source-drain metal layer in a stretchable region according to some embodiments of the disclosure.

As shown in FIG. 21 and FIG. 26, the second source-drain metal layer includes a plurality of source-drain leads and a second source-drain conductive structure of the pixel driving circuit.

The second source-drain conductive structure of the pixel driving circuit includes a column-wise power lead 411, a row-wise power lead 412, and a transfer pad 413, where the column-wise power lead 411 and the row-wise power lead 412 are connected to each other, and are electrically connected to the power lead structure 0411 of the pixel driving circuit through the via hole. The transfer pad 413 is connected to the third connection lead 213 of the pixel driving circuit through the via hole.

The source-drain leads located in the second source-drain metal layer include second source-drain leads 401, and the second source-drain leads 401 include a thirteenth metal lead 4313, a fourteenth metal lead 4314, a fifteenth metal lead 4315, and a sixteenth metal lead 4316 that are sequentially arranged along the preset direction C. The thirteenth metal lead 4313 extends to the pixel wiring area 022 and is connected to the column-wise power lead 411 of the pixel driving circuit. The fourteenth metal lead 4314 extends to the pixel wiring area 022 and is connected to the data lead structure 0421 of the third pixel driving circuit column through the via hole. The fifteenth metal lead 4315 extends to the pixel wiring area 020, and is connected to the data lead structure 0421 of the fourth pixel driving circuit column through the via hole. The sixteenth metal lead 4316 extends to the pixel wiring area 022 and is connected to the data lead structure 0421 of the sixth pixel driving circuit column through the via hole.

In this way, the first metal lead 231 is configured to load the data signal (Vdata) to the data lead structure 0421 of the first pixel driving circuit column. The second metal lead 232 is configured to load the data signal (Vdata) to the data lead structure 0421 of the second pixel driving circuit column. The fourth metal lead 234 is configured to load the data signal (Vdata) to the data lead structure 0421 of the fifth pixel driving circuit column. The thirteenth metal lead 4313 is configured to load the power supply voltage to the power lead structure 0411 of each pixel driving circuit column. The fourteenth metal lead 4314 is configured to load the data signal (Vdata) to the data lead structure 0421 of the third pixel driving circuit column. The fifth metal lead 4315 is configured to load the data signal (Vdata) to the data lead structure 0421 of the fourth pixel driving circuit column. The sixteenth metal lead 4316 is configured to load the data signal (Vdata) to the data lead structure 0421 of the sixth pixel driving circuit column.

The pixel electrode layer is provided with twelve pixel electrodes, with each pixel electrode is provided corresponding to the transfer pad 413 of respective pixel driving circuit, and the pixel electrode is electrically connected to its corresponding transfer pad 413 through the via hole.

Embodiments of the disclosure further provide a display apparatus, where the display apparatus includes any one of the flexible array substrates described in the flexible array substrate embodiments above. The display apparatus may be a helmet display, a quad-curved mobile phone or other types of display apparatus. Since the display apparatus is provided with any one of the flexible array substrates described in the above-mentioned embodiments of the flexible array substrate, it has the same beneficial effects, which will not be repeated herein.

It should be understood that the disclosure does not limit its application to the detailed structure and arrangement of components set forth in this specification. The disclosure may be embodied in other embodiments, and implemented and carried out in various ways. The forgoing variations and modifications should fall within the scope of the disclosure. It should be understood that the disclosure disclosed and defined in this specification extends to all alternative combinations of two or more of the individual features mentioned or evident in the text and/or drawings. All of these different combinations constitute various alternative aspects of the disclosure. The embodiments of this specification illustrate the examples known for carrying out the disclosure, and will enable any person skilled in the art to utilize the disclosure.

What is claimed is:

1. A flexible array substrate, comprising at least one stretchable region; wherein the flexible array substrate is provided with a plurality of through holes within the stretchable region, and the plurality of through holes divide the stretchable region into a pixel island area for displaying and a bridging area for signal transmission; the bridging area comprises a source-drain bridging area, and the flexible array substrate, in the source-drain bridging area, comprises:
a base substrate;
a first source-drain metal layer, provided on one side of the base substrate, and comprising a plurality of first source-drain leads;
a first insulating material layer, provided on one side of the first source-drain metal layer away from the base substrate;
a second source-drain metal layer, provided on one side of the first insulating material layer away from the base substrate; wherein the second source-drain metal layer comprises a plurality of second source-drain leads, and a number of the second source-drain leads is less than a number of the first source-drain leads;
a second insulating material layer, provided on one side of the second source-drain metal layer away from the base substrate; wherein the second insulating material layer is provided with a plurality of isolation grooves, and an orthographic projection of the isolation grooves on the second source-drain metal layer isolates the second source-drain leads and the through holes; and
an encapsulation layer, provided on one side of the second insulating material layer away from the base substrate.

2. The flexible array substrate according to claim 1, wherein, in the source-drain bridging area, a minimum distance between an orthographic projection of the second source-drain leads on the second insulating material layer and the isolation grooves is not less than a distance between two adjacent second source-drain leads.

3. The flexible array substrate according to claim 1, wherein, in the source-drain bridging area, a width of the isolation grooves is not greater than twice a distance between two adjacent second source-drain leads.

4. The flexible array substrate according to claim 1, wherein, in the source-drain bridging area, a width of the isolation grooves is equal to 0.9-1.1 times a distance between two adjacent second source-drain leads; more than one of the isolation grooves are provided between one of the second source-drain leads and one of the through holes adjacent thereto, and a distance between two adjacent isolation grooves is equal to 0.9-1.1 times the distance between two adjacent second source-drain leads.

5. The flexible array substrate according to claim 1, wherein, in the source-drain bridging area, a distance between two adjacent second source-drain leads is not greater than 2 times a width of the second source-drain leads.

6. The flexible array substrate according to claim 1, wherein, in the source-drain bridging area, the second source-drain leads are arranged at equal intervals; two adjacent through holes in the source-drain bridging area are located at a same minimum distance to the second source-drain leads.

7. The flexible array substrate according to claim 1, wherein, in the source-drain bridging area, a distance between two adjacent first source-drain leads is not greater than a distance between two adjacent second source-drain leads.

8. The flexible array substrate according to claim 1, wherein, in the source-drain bridging area, a minimum distance between an orthographic projection of the first source-drain lead on the second insulating material layer and the isolation groove is not greater than a minimum distance between an orthographic projection of the second source-drain lead on the second insulating material layer and the isolation groove.

9. The flexible array substrate according to claim 1, wherein, in the source-drain bridging area, an orthographic projection of the first source-drain lead on the second insulating material layer at least partially overlaps with the isolation groove.

10. The flexible array substrate according to claim 1, wherein, in the source-drain bridging area, a minimum distance between an orthographic projection of the first source-drain lead on the second insulating material layer and the isolation groove is 1.5-2.7 µm; a minimum distance between an orthographic projection of the second source-drain lead on the second insulating material layer and the isolation groove is 4.5-6.0 µm.

11. The flexible array substrate according to claim 1, wherein a number of the first source-drain leads is greater than a number of the second source-drain leads by 1 or 2.

12. The flexible array substrate according to claim 1, wherein a width of an end of the isolation groove away from the base substrate is smaller than a width of another end of the isolation groove close to the base substrate.

13. The flexible array substrate according to claim 1, wherein, in the source-drain bridging area, an extending direction of the first source-drain lead is parallel or perpendicular to an extending direction of the through hole; and an extending direction of the second source-drain lead is parallel or perpendicular to the extending direction of the through hole.

14. The flexible array substrate according to claim 1, wherein the pixel island area comprises a plurality of sub-pixels; a size of any one of the sub-pixels along a row direction is a first size, a distance between two adjacent second source-drain leads in the source-drain bridging area is a second size, and the first size is larger than the second size.

15. The flexible array substrate according to claim 1, wherein the through holes comprise a first strip hole extending in a row direction and a second strip hole extending in a column direction; and the source-drain bridging area is located between a widthwise end of the first strip hole and a lengthwise side of the second strip hole.

16. The flexible array substrate according to claim 15, wherein the pixel island area is located between two adjacent first strip holes, and is located between two adjacent second strip holes; the pixel island area comprises four pixels, and any one of the pixels comprises a red sub-pixel, a green sub-pixel and a blue sub-pixel.

17. The flexible array substrate according to claim 16, wherein, in the pixel island area, the four pixels are formed into two pixel rows, and any one of the pixel rows comprises two pixels arranged along the row direction; and wherein, in any one of the pixel rows, a pixel electrode of the blue sub-pixel and a pixel electrode of the red sub-pixel are arranged along the row direction, and are located at one side of a pixel electrode of the green sub-pixel away from another one of the pixel rows.

18. The flexible array substrate according to claim 1, wherein the flexible array substrate comprises a plurality of sub-pixels provided in an array in the pixel island area, any one of the sub-pixels comprises a pixel driving circuit and a pixel electrode electrically connected to the pixel driving circuit; and the pixel driving circuit comprises a storage capacitor, a first thin film transistor, a second thin film transistor, a third thin film transistor, a fourth thin film transistor, a fifth thin film transistor, a sixth thin film transistor and a seventh thin film transistor; wherein, a first end of the first thin film transistor is configured to load an initial signal, a second end of the first thin film transistor is electrically connected to a first electrode plate of the storage capacitor, and a control end of the first thin film transistor is configured to load a reset signal;

a first end of the second thin film transistor is electrically connected to a second end of the third thin film transistor and a first end of the sixth thin film transistor, and a second end of the second thin film transistor is electrically connected to the first electrode plate of the storage capacitor, and a control end of the second thin film transistor is configured to load a scan signal;

a first end of the third thin film transistor is electrically connected to a second end of the fourth thin film transistor and a second end of the fifth thin film transistor, and a control end of the third thin film transistor is electrically connected to the first electrode plate of the storage capacitor;

a first end of the fourth thin film transistor is configured to load a data signal, and a control end of the fourth thin film transistor is configured to load the scan signal;

a first end of the fifth thin film transistor is configured to load a power supply voltage, and a control end of the fifth thin film transistor is configured to load an enable signal;

a second end of the sixth thin film transistor is electrically connected to the pixel electrode, and a control end of the sixth thin film transistor is configured to load the enable signal;

a first end of the seventh thin film transistor is configured to load the initial signal, a second end of the seventh thin film transistor is electrically connected to the pixel electrode, and a control end of the seventh thin film transistor is configured to load the reset signal; and a second electrode plate of the storage capacitor is configured to load the power supply voltage.

19. The flexible array substrate according to claim 18, wherein the pixel island area comprises a first pixel driving circuit column, a second pixel driving circuit column, a third pixel driving circuit column, a fourth pixel driving circuit column, a fifth pixel driving circuit column and a sixth pixel driving circuit column arranged in sequence along a preset direction, any one of the first to sixth pixel driving circuit columns comprises a plurality of the pixel driving circuits arranged in a column direction, and the preset direction is parallel to a row direction;

in the source-drain bridging area, the number of the first source-drain leads is five; a first one of the first source-drain leads along the preset direction is configured to load the data signal to the first pixel driving circuit column; a second one of the first source-drain leads along the preset direction is configured to load the data signal to the second pixel driving circuit column; and a fourth one of the first source-drain leads along the preset direction is configured to load the data signal to the fifth pixel driving circuit column.

20. A display apparatus comprising the flexible array substrate according to claim 1.

* * * * *